(12) United States Patent
Fossum et al.

(10) Patent No.: US 8,687,174 B2
(45) Date of Patent: Apr. 1, 2014

(54) UNIT PIXEL, PHOTO-DETECTION DEVICE AND METHOD OF MEASURING A DISTANCE USING THE SAME

(75) Inventors: Eric R. Fossum, Wolfeboro, NH (US); Yoon-Dong Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 291 days.

(21) Appl. No.: 13/187,880

(22) Filed: Jul. 21, 2011

(65) Prior Publication Data

US 2012/0038904 A1 Feb. 16, 2012

Related U.S. Application Data

(60) Provisional application No. 61/372,709, filed on Aug. 11, 2010.

(30) Foreign Application Priority Data

Jan. 18, 2011 (KR) ........................ 10-2011-0004750

(51) Int. Cl.
*G01C 3/08* (2006.01)

(52) U.S. Cl.
USPC ........ 356/5.09; 356/4.09; 356/5.15; 356/28.5

(58) Field of Classification Search
USPC ................................ 356/4.09, 5.09, 5.15, 28.5
See application file for complete search history.

(56) References Cited

U.S. PATENT DOCUMENTS

| | | | | |
|---|---|---|---|---|
| 3,979,712 A | * | 9/1976 | Ettenhofer et al. | 367/125 |
| 4,626,888 A | * | 12/1986 | Nagano et al. | 257/153 |
| 5,223,725 A | * | 6/1993 | Miwada | 257/239 |
| 6,545,304 B2 | * | 4/2003 | Okamoto | 257/291 |
| 7,079,183 B1 | * | 7/2006 | Yamada | 348/294 |
| 7,184,138 B1 | * | 2/2007 | Li | 356/237.2 |
| 7,235,772 B2 | * | 6/2007 | Ko et al. | 250/208.1 |
| 7,253,461 B2 | * | 8/2007 | Yang et al. | 257/292 |
| 7,268,858 B2 | | 9/2007 | Kuijk et al. | |
| 7,450,220 B2 | | 11/2008 | O'Connor et al. | |
| 7,471,376 B2 | | 12/2008 | Bamji et al. | |
| 7,541,588 B2 | | 6/2009 | Tabirian et al. | |
| 8,344,306 B2 | * | 1/2013 | Kim | 250/208.1 |
| 8,350,939 B2 | * | 1/2013 | Yin et al. | 348/308 |
| 8,441,565 B2 | * | 5/2013 | Suzuki et al. | 348/300 |
| 2009/0095047 A1 | * | 4/2009 | Patel et al. | 73/1.01 |
| 2010/0039616 A1 | * | 2/2010 | Yumikake et al. | 351/206 |

OTHER PUBLICATIONS

Moore, Wayne E. Interferometer Stabilizer. US Patent 3977788 A. Date of Patent Aug. 31, 1976.*

* cited by examiner

*Primary Examiner* — Isam Alsomiri
*Assistant Examiner* — Samantha K Abraham
(74) *Attorney, Agent, or Firm* — Lee & Morse, P.C.

(57) ABSTRACT

A unit pixel included in a photo-detection device, the unit pixel including a floating diffusion region in a semiconductor substrate, a ring-shaped collection gate over the semiconductor substrate, a ring-shaped drain gate over the semiconductor substrate, and a drain region in the semiconductor substrate, wherein the collection gate and the drain gate are respectively arranged between the floating diffusion region and the drain region.

21 Claims, 23 Drawing Sheets

UNIT PIXEL

| CGi | Ti | Wi | ni |
|---|---|---|---|
| 1 | 0.00E+00 | 3.64E-09 | 1,054 |
| 2 | 1.82E-09 | 4.01E-09 | 5,556 |
| 3 | 3.83E-09 | 4.41E-09 | 13,803 |
| 4 | 6.03E-09 | 4.85E-09 | 27,136 |
| 5 | 8.46E-09 | 5.34E-09 | 46,958 |
| 6 | 1.11E-08 | 5.87E-09 | 75,001 |
| 7 | 1.41E-08 | 6.46E-09 | 113,396 |
| 8 | 1.73E-08 | 7.10E-09 | 164,765 |
| 9 | 2.08E-08 | 7.81E-09 | 232,322 |
| 10 | 2.47E-08 | 8.59E-09 | 320,008 |
| | | | M= 1,000,000 |

| CGi | Ti | Wi | ni |
|---|---|---|---|
| 1 | 0.00E+00 | 1.67E-08 | 1,377 |
| 2 | 8.33E-09 | 1.67E-08 | 137,741 |
| 3 | 1.67E-09 | 1.67E-08 | 309,917 |
| 4 | 2.50E-09 | 1.67E-08 | 550,964 |
| | | | M= 1,000,000 |

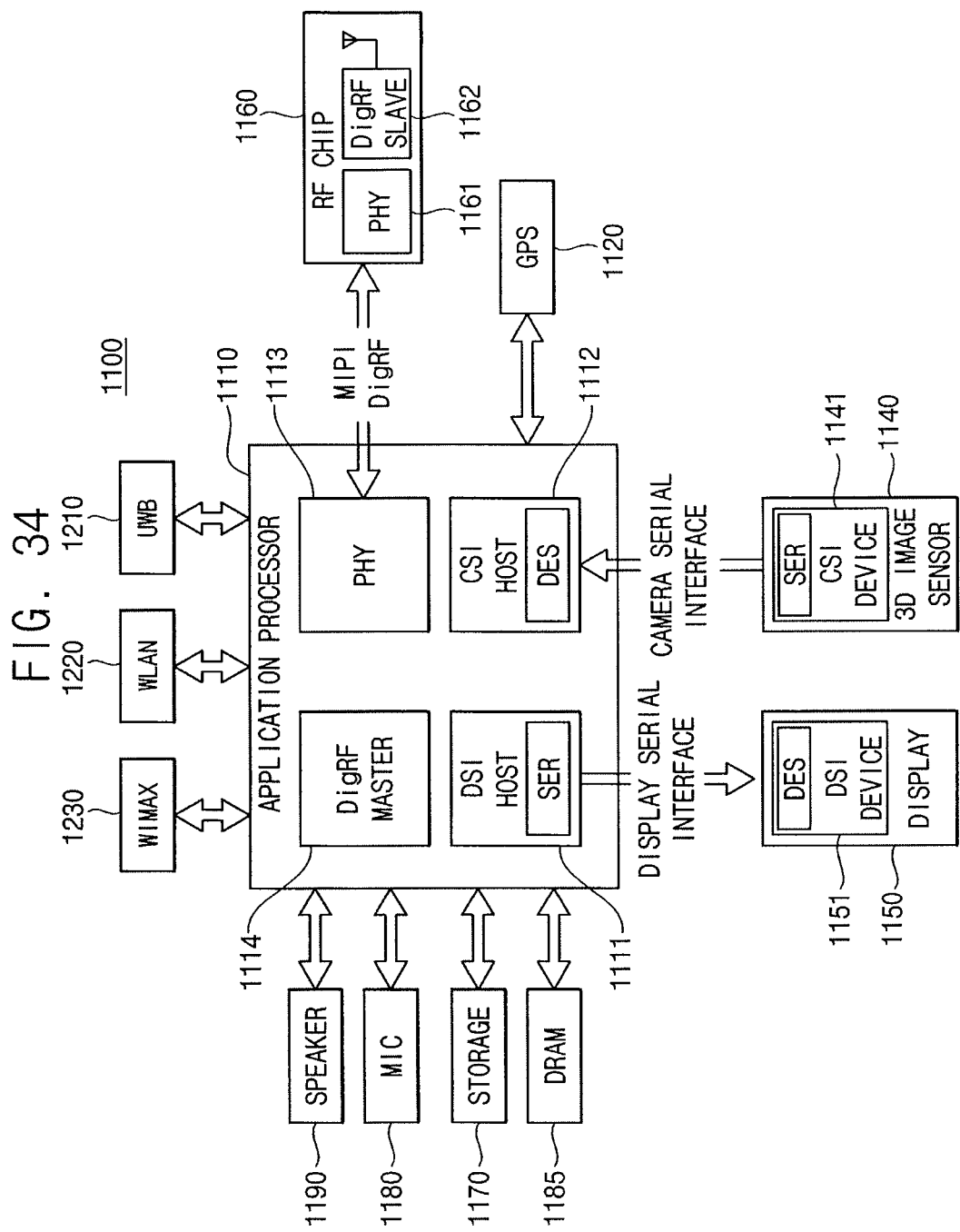

UNIT PIXEL, PHOTO-DETECTION DEVICE AND METHOD OF MEASURING A DISTANCE USING THE SAME

CROSS-REFERENCE TO RELATED APPLICATIONS

The present application claims priority under 35 USC §119 (e) to U.S. Provisional Application No. 61/372,709, filed on Aug. 11, 2010, and Korean Patent Application No. 2011-0004750, filed on Jan. 18, 2011, which are incorporated herein by reference in their entirety.

BACKGROUND

1. Field

Exemplary embodiments relate to photo-detection devices. More particularly, exemplary embodiments relate to unit pixels having ring-shaped structures, photo-detection devices including unit pixels having ring-shaped structures, and methods of measuring distances using unit pixels having ring-shaped structures.

2. Description of the Related Art

An image sensor is a photo-detection device that converts optical signals including image and/or distance (i.e., depth) information about an object into electrical signals. Various types of image sensors, such as charge-coupled device (CCD) image sensors, CMOS image sensors (CISs), etc., have been developed to provide high quality image information about the object. Recently, a three-dimensional (3D) image sensor is being researched and developed which provides depth information as well as two-dimensional image information.

The three-dimensional image sensor may obtain the depth information using infrared light or near-infrared light as a light source. The three-dimensional image sensor may have a lower signal-to-noise ratio (SNR) and lower sensitivity than a conventional two-dimensional image sensor, which results in incorrect depth information being obtained.

SUMMARY

One or more embodiments provide a unit pixel of a photo-detection device having high sensitivity and an improved signal-to-noise ratio.

One or more embodiments provide a photo-detection device including the unit pixel.

One more embodiments provide a method of measuring a distance to an object using the photo-detection device.

One or more embodiments may provide a unit pixel having a ring-shaped single-tap structure that efficiently collects and drains photo-charges to precisely measure a distance to an object.

One or more embodiments may provide a pixel array and a photo-detection device including unit pixels that do not require an anti-blooming structure by integrally forming drain regions that correspond to an outermost part of a unit pixel, thereby improving an overall design margin.

One or more embodiments may provide a photo-detection device and a method of measuring a distance that may have a high signal-to-noise ratio by obtaining depth information using variable bin signals depending on the distance to an object.

One or more embodiments may provide a unit pixel included in a photo-detection device, the unit pixel including a floating diffusion region in a semiconductor substrate, a ring-shaped collection gate over the semiconductor substrate, a ring-shaped drain gate over the semiconductor substrate, and a drain region in the semiconductor substrate, wherein the collection gate and the drain gate are respectively arranged between the floating diffusion region and the drain region.

The collection gate may surround the floating diffusion region, the drain gate may surround the collection gate, and the drain region may surround the drain gate.

The floating diffusion region may be located at a center, and in comparison to the collection gate and the drain gate, the drain region is outermost relative to the floating diffusion region.

The collection gate and the drain gate may have circular or polygonal ring shapes.

A collection gate signal and a drain gate signal may be applied to the collection gate and the drain gate, respectively, wherein photo-charges generated in the semiconductor substrate are collected in the floating diffusion region while the collection gate signal is activated, and wherein the photo-charges generated in the semiconductor substrate are drained into the drain region while the drain gate signal is activated.

A ring-shaped photo-charge storing region in the semiconductor substrate between the floating diffusion region and the drain region, the photo-charge storing region being doped with impurities of an opposite conductivity type to that of the semiconductor substrate.

The collection gate may at least partially overlap an inner portion of the photo-charge storing region, and wherein the drain gate may at least partially overlap an outer portion of the photo-charge storing region.

The collection gate is between the photo-charge storing region and the floating diffusion region, and wherein the drain gate is between the photo-charge storing region and the drain region.

The unit pixel may include a ring-shaped pinning layer in the semiconductor substrate to cover the photo-charge storing region, the pinning layer being doped with impurities of an opposite conductivity type to that of the photo-charge storing region.

The unit pixel may include a ring-shaped photo gate over the semiconductor substrate between the collection gate and the drain gate to cover the photo-charge storing region.

The semiconductor substrate may include a plurality of photo-charge generating regions doped with impurities of a same conductivity type and different concentrations.

One or more embodiments may provide a photo-detection device, including a sensing unit configured to convert received light to an electrical signal, the sensing unit including at least one unit pixel, and a control unit configured to control the sensing unit.

The sensing unit may include a pixel array in which a plurality of unit pixels is arranged in a rectangular or triangular grid.

Drain regions of the plurality of unit pixels may be integrally formed and are spatially coupled to each other in the semiconductor substrate.

Floating diffusion regions of at least two of the plurality of unit pixels may be electrically coupled to each other and correspond to a pixel group.

The unit pixels may be regularly omitted at least at one grid point of the grid, and the sensing unit may include a readout circuit at the grid point where the unit pixel is omitted to provide outputs of the plurality of unit pixels.

The plurality of unit pixels may include color pixels and depth pixels, and the photo-detection device may be a three-dimensional image sensor.

One or more embodiments may provide a method of measuring a distance, the method including emitting light to an object, converting received light corresponding to the emitted light into an electrical signal using a plurality of bin signals having numbers of cycles that increase according to phase differences with respect to the emitted light, and calculating a distance to the object based on the electrical signal, wherein the received light is converted into the electrical signal using a unit pixel, the unit pixel including a floating diffusion region in a semiconductor substrate, a ring-shaped collection gate over the semiconductor substrate, a ring-shaped drain gate over the semiconductor substrate, and a drain region in the semiconductor substrate, wherein the collection gate and the drain gate are respectively arranged between the floating diffusion region and the drain region.

Duty ratios of the plurality of bin signals may increase according to the phase differences with respect to the emitted light.

Converting the received light into the electrical signal may include collecting photo-charges generated by the received light in a floating diffusion region while the plurality of bin signals are activated, and draining the photo-charges generated by the received light into a drain region while the plurality of bin signals are deactivated.

The method may include adjusting phases and duty ratios of the plurality of bin signals to be concentrated on a phase corresponding to the calculated distance, and correcting the distance to the object using the plurality of bin signals having the adjusted phases and duty ratios.

One or more embodiments may provide a method of measuring a distance, the method including emitting light to an object, converting received light corresponding to the emitted light into an electrical signal using a plurality of bin signals having numbers of cycles that increase according to phase differences with respect to the emitted light, and calculating a distance to the object based on the electrical signal, wherein the received light is converted into the electrical signal using a single-tap pixel having a ring-shaped structure where a floating diffusion region of the pixel is located at a center of the ring-shaped structure and a drain region of the pixel is arranged an outer portion of the ring-shaped structure.

BRIEF DESCRIPTION OF THE DRAWINGS

Features will become more apparent to those of ordinary skill in the art by describing in detail exemplary embodiments with reference to the attached drawings, in which:

FIG. 34 illustrates a block diagram of an exemplary embodiment of an interface employable in the computing system of FIG. 33.

DETAILED DESCRIPTION

Figure 1:
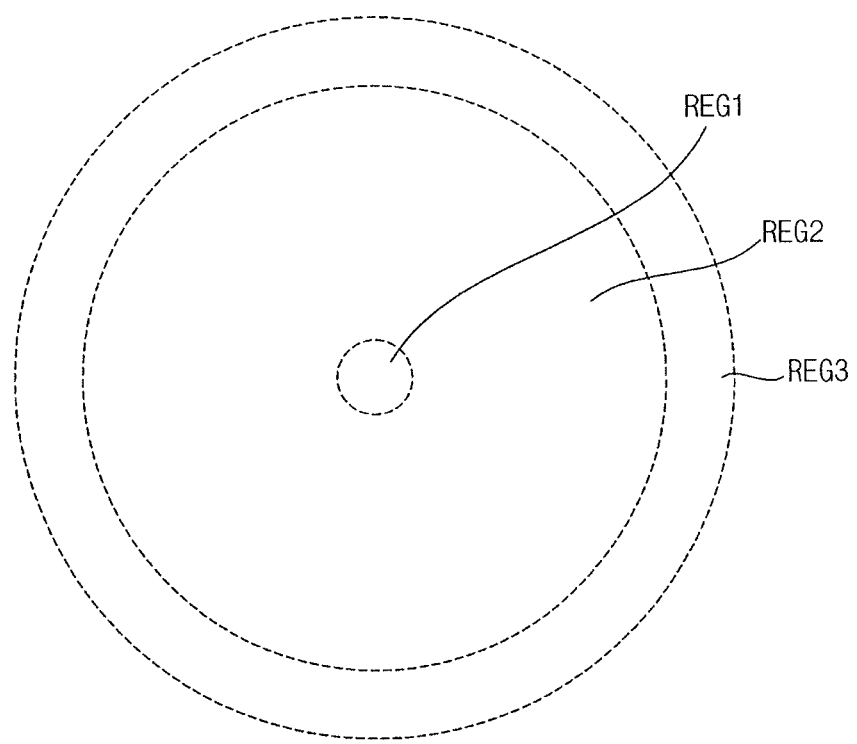
FIG. 1 illustrates a layout diagram of an exemplary embodiment of a unit pixel of a photo-detection device.

Various exemplary embodiments will be described more fully hereinafter with reference to the accompanying drawings, in which some exemplary embodiments are shown. Features may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout the specification. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Further, an element "between" or "surrounding" other elements may be between or may surround the other elements along a same or different planes. More particularly, e.g., the element may extend along a different plane than one or more of the other elements extending along another element, but from a plan view, the element may be between and/or surrounding the other elements.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a layout diagram of an exemplary embodiment of a unit pixel of a photo-detection device.

Referring to FIG. 1, a unit pixel may include a first region REG1, a second region REG2 and a third region REG3. The first region REG1 may be located at the center of the unit pixel. The second region REG2 may surround the first regions REG1. The third region REG3 may surround the second region REG2. The unit pixel may have a ring-shaped structure. The first region REG1, the second region REG2, and/or the third region REG3 may each have a ring shaped structure, e.g., a circular, polygonal ring structure. More particularly, although an example of a circular unit pixel is illustrated in FIG. 1, embodiments of the ring-shaped structure of the unit pixel are not limited to a circle, and may be, for example, a polygon or a regular polygon.

As will be described in detail below with reference to FIGS. 2 through 12, the first region REG1 may correspond to a floating diffusion region for collecting photo-charges. The third region REG3 may correspond to a drain region for draining the photo-charges. The second region REG2 between the first region REG1 and the third region REG3 may correspond to a gate region where at least one gate is formed.

In some embodiments, the unit pixel may be formed by a CMOS process using a semiconductor substrate. Similar to a conventional CMOS process, the floating diffusion region as the first region REG1 and the drain region as the third region REG3 may be formed in the semiconductor substrate using an ion implantation process or the like. The gate region as the second region REG2 may be formed over the semiconductor substrate using a deposition process, an etch process, etc.

Figure 2:
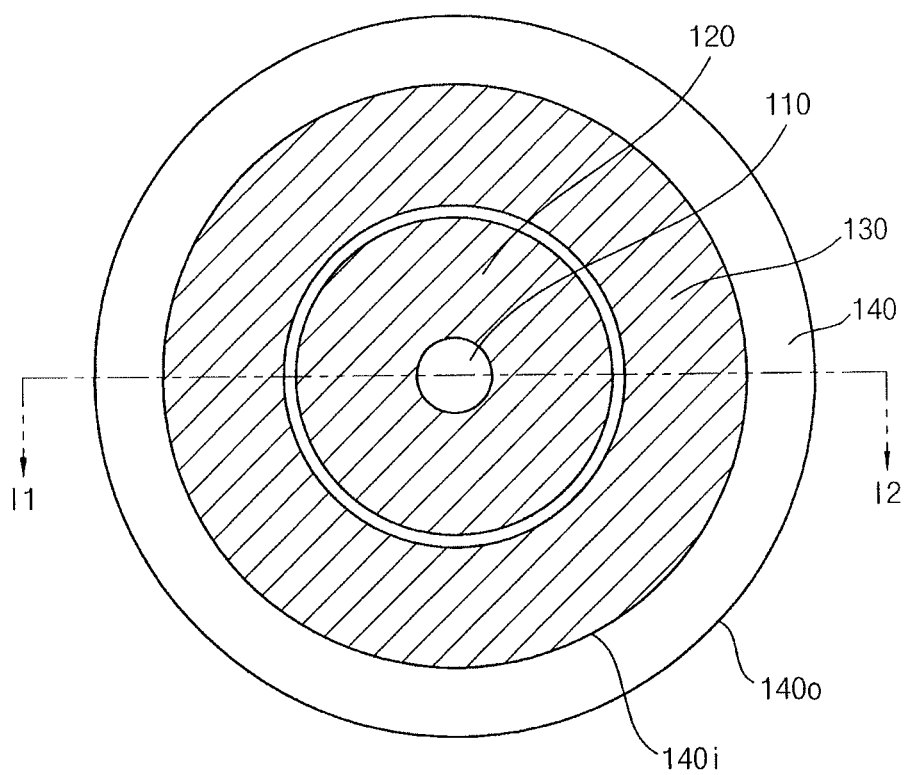
FIG. 2 illustrates a plan view of an exemplary embodiment of a unit pixel of a photo-detection device.

FIG. 2 illustrates a plan view of an exemplary embodiment of a unit pixel 100 of a photo-detection device.

Referring to FIG. 2, the unit pixel 100 may include a floating diffusion region 110, a collection gate 120, a drain gate 130 and a drain region 140. The collection gate 120 may be formed over a semiconductor substrate. When viewed from the top of the unit pixel 100, the collection gate 120 may have a ring shape surrounding the floating diffusion region 110 formed in the semiconductor substrate. The drain gate 130 may be formed over the semiconductor substrate. When viewed from the top, the drain gate 130 may have a ring shape surrounding the collection gate 120. The drain region 140 may be formed in the semiconductor substrate. When viewed from the top, the drain region 140 may surround the drain gate 130. The drain region 140 may have a ring shape.

As will be described in detail below with reference to FIGS. 3 and 4, the unit pixel 100 may be formed by a CMOS process on the semiconductor substrate. The floating diffusion region 110 and the drain region 140 may be formed in the semiconductor substrate. The collection gate 120 and the drain gate 130 may be formed over the semiconductor substrate.

Although the ring-shaped collection gate 120 and the ring-shaped drain gate 130 are illustrated in FIG. 2 as having circular shapes, embodiments are not limited thereto. For example, the ring-shaped collection gate 120 and the ring-shaped drain gate 130 may have regular polygonal shapes, as, e.g., generally illustrated in FIGS. 15 and 16.

More particularly, e.g., in one or more embodiments, an inner edge 140$i$ of the drain region 140 may have the same shape as the collection gate 120 and the drain gate 130. An outer edge 140$o$ of the drain region 140 may have a same or different shape from the collection gate 120 and/or the drain gate 130. For example, in a case where a plurality of unit pixels are arranged in an array, drain regions of adjacent unit pixels may be spatially coupled to each other and may be integrally formed in the semiconductor substrate. In such embodiments, since the drain regions are integrally formed, the outer edge of a drain region may not be defined for a specific unit pixel.

Figure 3:
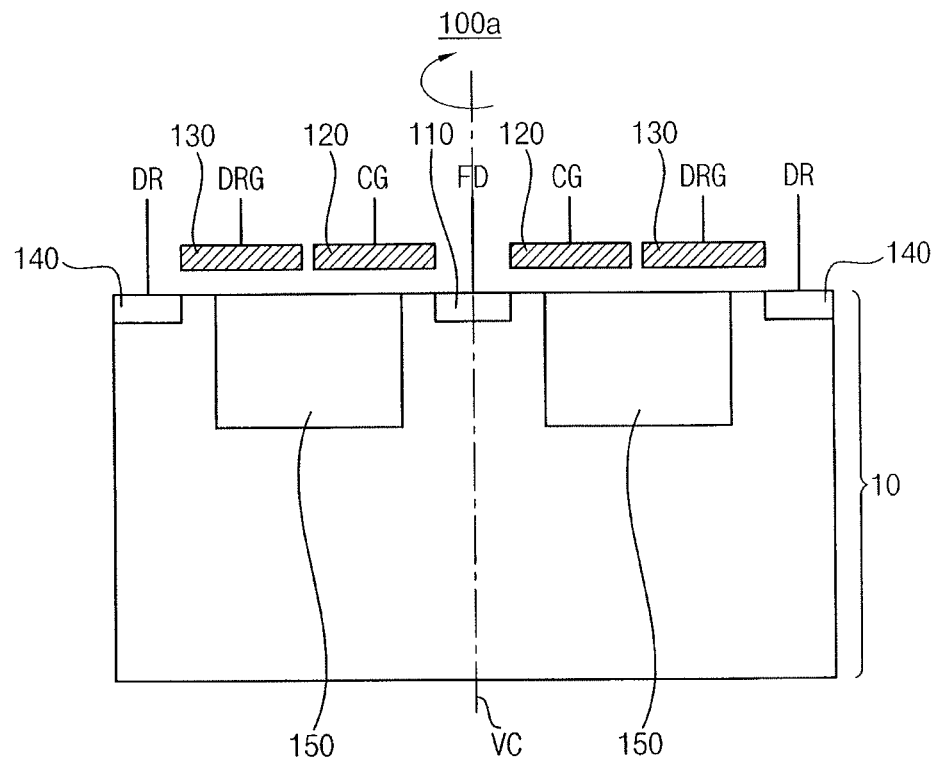
FIGS. 3 and 4 illustrate cross-sectional views of exemplary embodiments of the unit pixel of FIG. 2.
Figure 4:
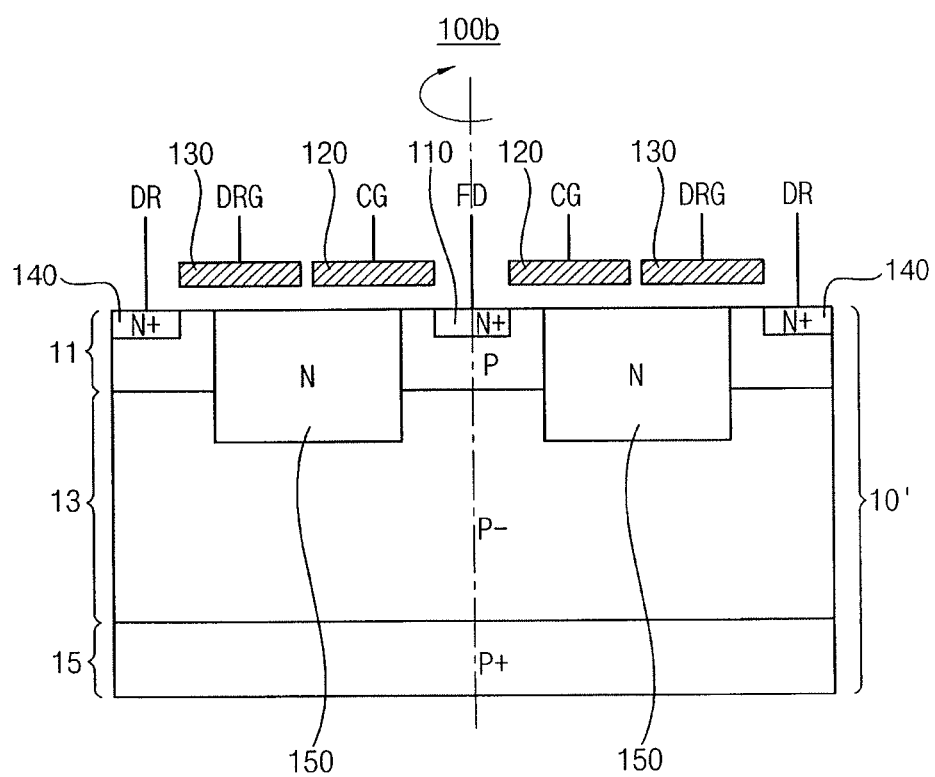

FIGS. 3 and 4 illustrate cross-sectional views of exemplary embodiments of the unit pixel 100, taken along a line I1-I2 of FIG. 2. Since the unit pixel 100 of FIG. 2 has a ring-shaped structure that is substantially circularly symmetric about the center, the line I1-I2 may be any line that passes through the center of the unit pixel 100.

Referring to FIG. 3, a unit pixel 100a may include a floating diffusion region 110 formed in a semiconductor substrate 10, a collection gate 120 formed over the semiconductor substrate 10, a drain gate 130 formed over the semiconductor substrate 10, and a drain region 140 formed in the semiconductor substrate 10. As described above, the floating diffusion region 110, the collection gate 120, the drain gate 130 and the drain region 140 may each have a ring-shaped structure that is substantially circularly symmetric about a vertical center axis VC.

The floating diffusion region 110 and the drain region 140 may extend from an upper surface of the semiconductor substrate 10 into the semiconductor substrate 10. The floating diffusion region 110 and the drain region 140 may be formed using, e.g., an ion implantation process or the like. The collection gate 120 and the drain gate 130 may be formed over the semiconductor substrate 10 using a deposition process, an etch process, etc. The collection gate 120 and the drain gate 130 may be spaced apart from the upper surface of the semiconductor substrate 10. Although it is not illustrated, an insulation layer, such as an oxide layer, may be formed between the upper surface of the semiconductor substrate 10 and the collection and drain gates 120, 130.

The collection gate 120 and the drain gate 130 may include, e.g., polysilicon, transparent conducting oxide (TCO), such as indium tin oxide (ITO), indium zinc oxide (IZO), zinc oxide (ZnO), titanium dioxide ($TiO_2$), etc.

More particularly, e.g., in one or more embodiments in which light incident on the unit pixel 100a passes through the upper surface of the semiconductor substrate 10, the collection gate 120 and the drain gate 130 may include, e.g., transparent conducting oxide. In one or more embodiments in which light incident on the unit pixel 100a passes through a lower surface of the semiconductor substrate 10, the collection gate 120 and the drain gate 130 may include, e.g., non-transparent conducting oxide.

Referring to FIGS. 3 and 4, the unit pixel 100a may include a photo-charge storing region 150. The photo-charge storing region 150 may be formed in the semiconductor substrate 10 between the floating diffusion region 110 and the drain region 140. The photo-charge storing region 150 may have a ring shape. The photo-charge storing region 150 may be doped with impurities of an opposite conductivity type to that of the semiconductor substrate 10. The photo-charge storing region 150 may be spaced apart from the floating diffusion region 110 and the drain region 140. The photo-charge storing region 150 may at least partially overlap with the collection and drain gates 120 and 130. In some embodiments, the semiconductor substrate 10 may be a P-type semiconductor substrate, and the photo-charge storing region 150 may be doped with N-type impurities. In other embodiments, the semiconductor substrate 10 may be an N-type semiconductor substrate or may include an N-type well, and the photo-charge storing region 150 may be doped with P-type impurities.

More particularly, as illustrated in FIG. 3, in one or more embodiments, the collection gate 120 may be formed in a ring shape and may cover an inner portion of the photo-charge storing region 150. The drain gate 130 may be formed in a ring shape to cover an outer portion of the photo-charge storing region 150. The collection gate 120 may be spaced apart from the drain gate 130. In such embodiments, the photo-charge storing region 150 may be first formed in the ring shape, and the gates 120, 130 may be subsequently formed in their respective ring shapes according to the shape of the photo-charge storing region 150 so as to overlap respective portions thereof.

A collection gate signal CG and a drain gate signal DRG may be applied to the collection gate 120 and the drain gate 130, respectively. In some embodiments, the collection gate signal CG and the drain gate signal DRG may be complementarily activated (see, e.g., FIGS. 5 and 6). If the collection gate signal CG is activated, a channel is formed in a region of the semiconductor substrate 10 under the collection gate 120, or in the region between the photo-charge storing region 150 and the floating diffusion region 110. If the drain gate signal DRG is activated, a channel is formed in a region of the semiconductor substrate 10 under the drain gate 130, or in the region between the photo-charge storing region 150 and the drain region 140.

Accordingly, while the collection gate signal CG is activated, photo-charges generated in the semiconductor substrate 10 may be collected into the floating diffusion region 110. While the drain gate signal DRG is activated, the photo-charges generated in the semiconductor substrate 10 may be drained into the drain region 140. A drain voltage DR applied to the drain region 140 may have an appropriate voltage level according to a conductivity type of the semiconductor substrate 10 and a voltage level of the drain gate signal DRG.

A time-of-flight (TOF) photo-detection device measures light reflected by an object to determine a distance to the object. Typically, a lock-in-type detection method using two bins or four bins is widely used to determine the distance.

In the typical lock-in-type detection method, theses bins are phase-shifted from each other by 180 degrees (in case of two bins) or 90 degrees (in case of four bins), and a sinusoidally modulated wave or a pulse train signal of 50% duty cycle is used for the bins. For the lock-in-type detection method, a unit pixel having a multi-tap structure is generally used in which a photo-charge storing region and/or a photo-charge generating region are shared by a plurality of floating diffusion regions.

Referring to FIGS. 1-3, in one or more embodiments, a single floating diffusion region, e.g., 110, may be associated with a photo-charge storing region, e.g., 150, such that only one floating diffusion region, e.g., 110, is required per unit pixel to provide an output. More particularly, as described above, the unit pixel 100 may have a ring-shaped structure surrounding the floating diffusion region 110 in the center. In one or more embodiments, the outermost drain region 140 may be included to drain undesired photo-charges that are generated, e.g., during an undesired time period.

The photo-charges collected in the floating diffusion region 110 may be output as a floating diffusion voltage FD through a readout circuit described below, and may be converted into an electrical signal corresponding to the amount of the collected photo-charges. Thus, in one or more embodiments, the unit pixel 100 may be used as a single-tap detector that provides an output using one floating diffusion region 110.

Referring to FIG. 4, a unit pixel 100b, similar to the unit pixel 100a of FIG. 3, may include the floating diffusion region 110 formed in a semiconductor substrate 10', the collection gate 120 formed over the semiconductor substrate 10, the drain gate 130 formed over the semiconductor substrate 10', and the drain region 140 formed in the semiconductor substrate 10'. The unit pixel 100b may also include the photo-charge storing region 150 described above. Duplicated description of like components of the exemplary embodiments of FIGS. 3 and 4 will be omitted. That is, in general, only differences between the unit pixel 100a of FIG. 3 and the unit pixel 100b of FIG. 4 will be described below.

Referring to FIG. 4, the semiconductor substrate 10' of the unit pixel 100b of FIG. 4 may include a plurality of regions 11, 13 and 15 that are doped with impurities of the same conductivity type and different concentrations. For example, in a case where the semiconductor substrate 10' has P-type conductivity, the semiconductor substrate 10' may include, in order from an upper surface of the semiconductor substrate 10', a P region 11, a P− region 13 and a P+ region 15. The P− region 13 is more lightly doped than the P region 11, and the P+ region 15 is more heavily doped than the P region 11.

In a case where near-infrared (NIR) light having a wavelength ranging from about 700 nm to about 850 nm is used as a light source in a TOF photo-detection device, a P-type semiconductor substrate may be used as the semiconductor substrate 10'. In one or more embodiments, a thickness of the P− region 13 may range from about 2 um to about 20 um. More particularly, e.g., in some embodiments, a thickness of the P− region 13 may range from about 3 um to about 5 um.

Photons incident on the unit pixel 100b may enter the P− region 13, and may generate electron-hole pairs in the P− region 13. That is, the P− region 13 may correspond to a main photo-charge generating region where photo-charges may be mainly generated. Photo-electrons generated as minority carriers may move into a depletion region of an N-P junction at a boundary between the photo-charge storing region 150 and the P− region 13, and may then be diffused and collected in the photo-charge storing region 150. The photo-charge storing region 150 may be substantially fully depleted, and may be similar to a buried channel of a charge-coupled device CCD. Further, since the P+ region 15, which is heavily doped, is located below the P− region 13, the photo-electrons generated near a boundary between the P− region 13 and the P+ region 15 may tend to move into the N-P junction portion.

As described above, the semiconductor substrate 10 may include a plurality of photo-charge generating regions 11, 13 and 15 that are doped with impurities of different concentrations, and may improve a sensitivity of the unit pixel 100b.

Figure 5:
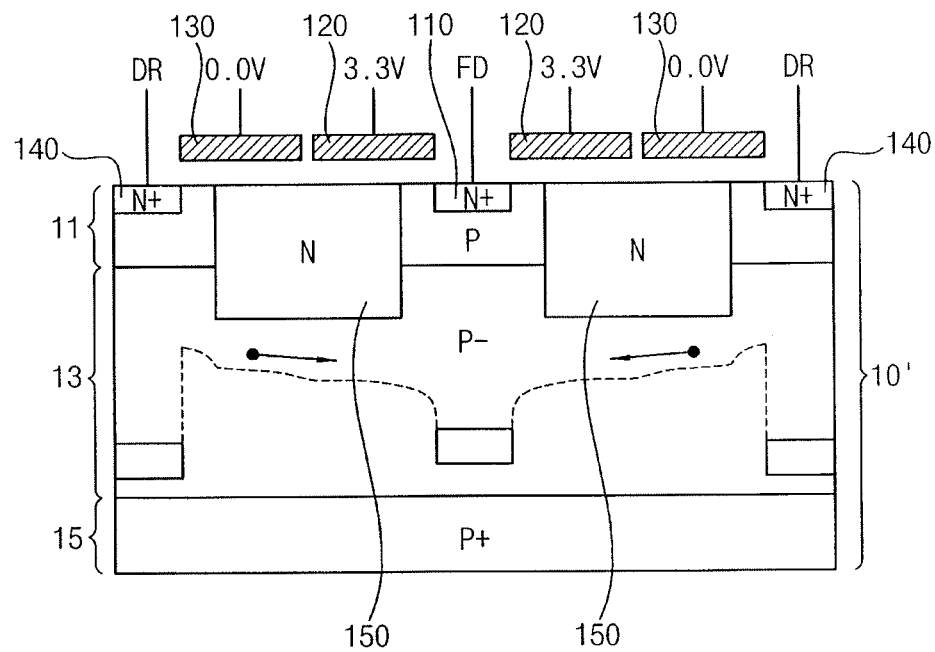
FIGS. 5 and 6 illustrate cross-sectional diagrams for describing examples of horizontal movement of photo-charges in the unit pixels of FIGS. 3 and 4.
Figure 6:
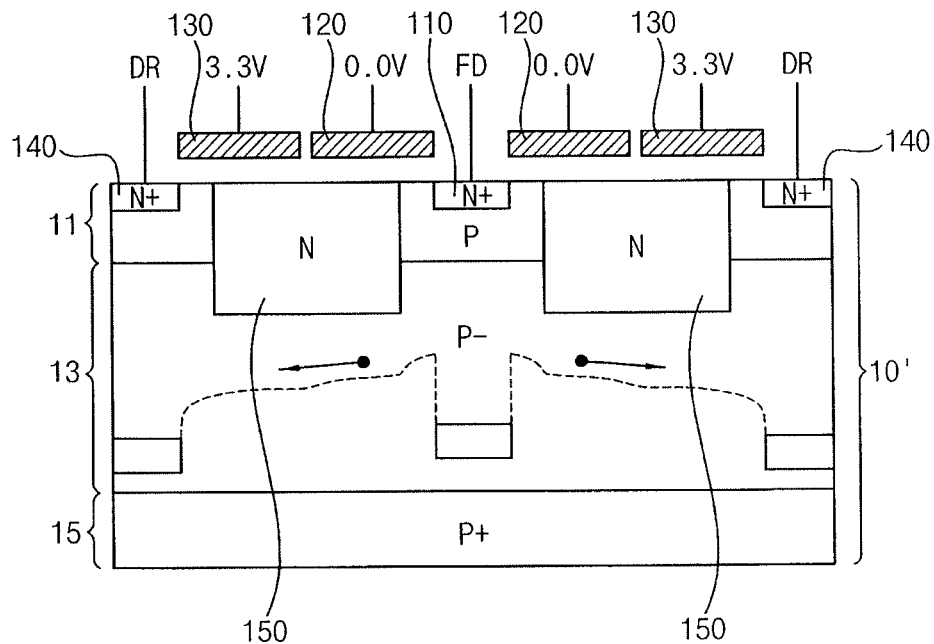

FIGS. 5 and 6 illustrate cross-sectional diagrams for describing examples of horizontal movement of photo-charges in the unit pixels of FIGS. 3 and 4. More particularly, FIG. 5 illustrates the unit pixel 100b of FIG. 4 operating in a collection mode, and FIG. 6 illustrates the unit pixel 100b of FIG. 4 operating in a rejection mode.

Referring to FIG. 5, in the collection mode, a collection gate signal CG applied to the collection gate 120 is activated, and a drain gate signal DRG applied to the drain gate 130 is deactivated. For example, the collection gate signal CG may be activated to a relatively high voltage of about 3.3 V, and the drain gate signal DRG may be deactivated to a relatively low voltage of about 0.0 V.

As illustrated in FIG. 5, an electric potential wall may be formed between a drain region 140 and a photo-charge storing region 150, and may block the movement of photo-electrons. The photo-electrons diffused into the photo-charge storing region 150 may be collected in a floating diffusion region 110 through a channel formed near the upper surface of the semiconductor substrate 10' between the photo-charge storing region 150 and the floating diffusion region 110. Since the unit pixel has a ring-shaped structure, the photo-electrons may horizontally move toward the center (i.e., in a centripetal direction), and thus, may be collected in the floating diffusion region 110.

Referring to FIG. 6, in the rejection mode, the collection gate signal CG applied to the collection gate 120 is deactivated, and the drain gate signal DRG applied to the drain gate 130 is activated. For example, the collection gate signal CG may be deactivated to a relatively low voltage of about 0.0 V, and the drain gate signal DRG may be activated to a relatively high voltage of about 3.3 V.

As illustrated in FIG. 6, an electric potential wall may be formed between the floating diffusion region 110 and the photo-charge storing region 150, and may block the movement of the photo-electrons. The photo-electrons diffused into the photo-charge storing region 150 may be drained into the drain region 140 through a channel formed near the upper surface of the semiconductor substrate 10' between the photo-charge storing region 150 and the drain region 140. Since the unit pixel has a ring-shaped structure, the photo-electrons may horizontally move away from the center (i.e., in a centrifugal direction), and thus, may be drain into the drain region 140.

A drain voltage DR may be maintained at a bias voltage of an appropriate voltage level as illustrated in FIGS. 5 and 6. For example, the drain voltage DR may be a power supply voltage of a photo-detection device including the unit pixel, e.g., 100b.

One or more embodiments of a unit pixel, e.g., 100a, 100b, including, e.g., a ring-shaped structure as described above, may allow the photo-charges to be collected by the horizontal movement in the centripetal direction or to be drained by the horizontal movement in the centrifugal direction according to the gate signals CG and DRG, and may improve sensitivity and/or signal-to-noise ratio of the unit pixel, e.g., 100a, 100b. One or more embodiments of a unit pixel, e.g., 100a, 100b, may enable accurate depth information to be obtained by repeating the collection mode that transfers desired charge carriers to the floating diffusion region 110 and the rejection mode that drains undesired charge carriers to the drain region 140.

Although the exemplary unit pixel 100b operating in the collection mode and the rejection mode is illustrated in FIGS. 5 and 6, respectively, the unit pixel 100b may operate in other modes according to the manner in which voltages are applied. For example, a bias voltage of an intermediate level may be applied to the collection gate 120 and the drain gate 130. In one or more embodiments, carriers generated in the P− region 13 may be collected in the photo-charge storing region 150, and the drain region 140 may function as an anti-blooming drain. Thereafter, while the collection gate signal CG is activated, the carriers collected in the photo-charge storing region 150 may be transferred to the floating diffusion region 110. By applying this mode to the unit pixel, correlated double sampling (CDS) may be performed, and image information, as well as depth information, may be provided.

A specific structure of the unit pixel for implementing the electric potential distribution illustrated in FIGS. 5 and 6 and specific voltage levels of the gate signals CG and DRG and the drain voltage DG may be determined by a process simulation and/or modeling.

Figure 7:
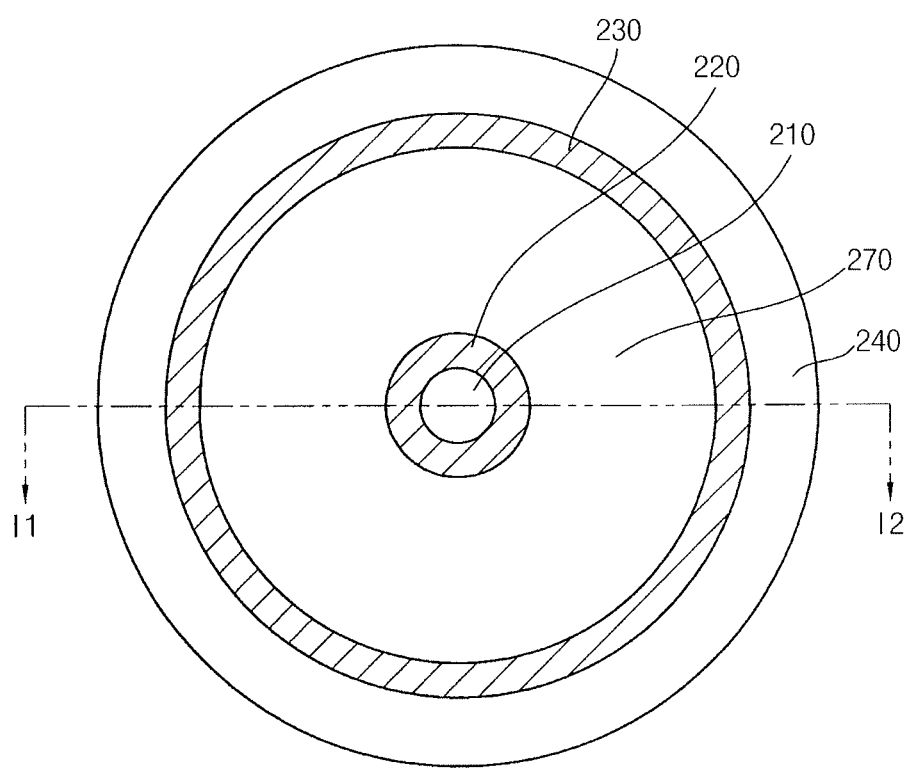
FIG. 7 illustrates a plan view of another exemplary embodiment of a unit pixel of a photo-detection device.
Figure 8:
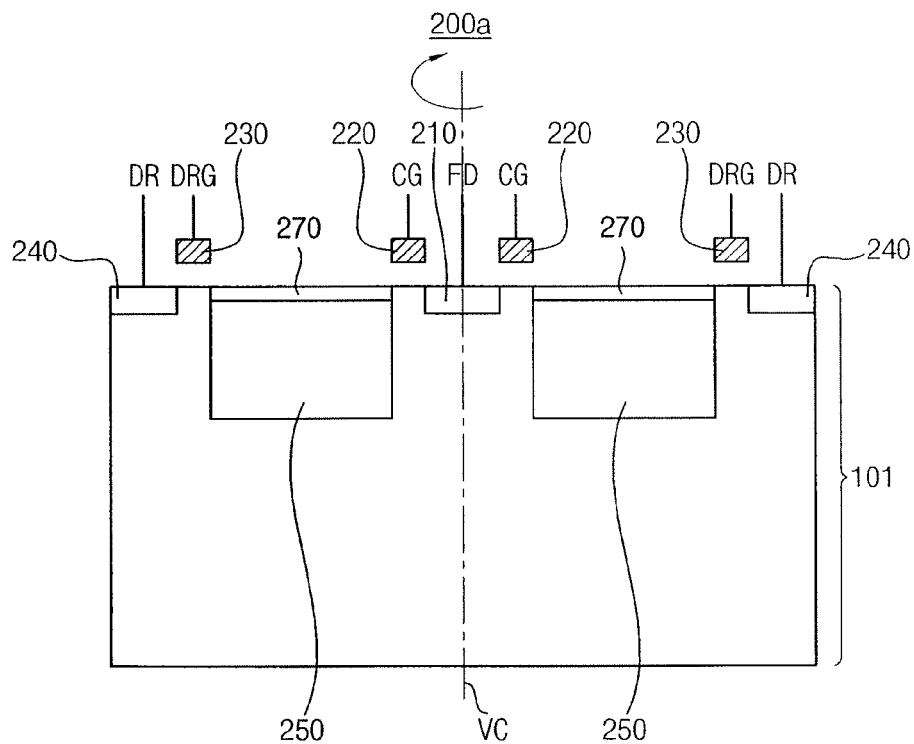
FIGS. 8 and 9 illustrate cross-sectional views of exemplary embodiments of the unit pixel of FIG. 7.
Figure 9:
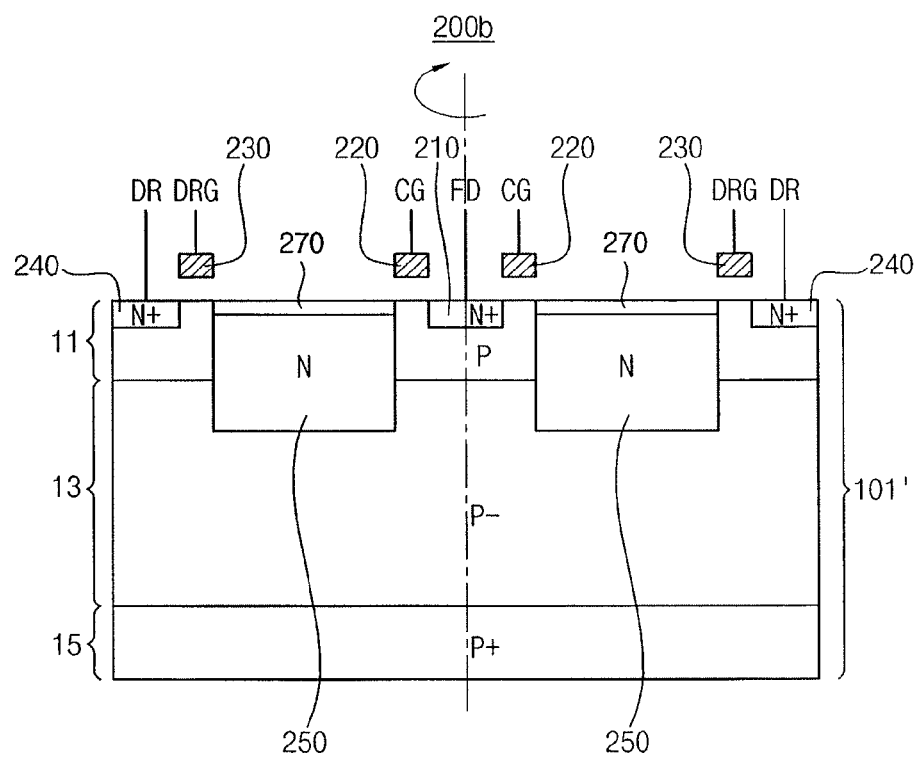

FIG. 7 illustrates a plan view of another exemplary embodiment of a unit pixel 200 of a photo-detection device. FIGS. 8 and 9 illustrate cross-sectional views of exemplary embodiments of the unit pixel 200 of FIG. 7. In general, only differences between the unit pixel 200 of FIG. 7 and the unit pixel 100 of FIG. 2 will be described below.

Referring to FIG. 7, the unit pixel 200 may include a floating diffusion region 210, a collection gate 220, a drain gate 230, and a drain region 240. Similar to the unit pixel 100 of FIG. 2, when viewed from the top of the unit pixel 200, the collection gate 220 may be formed on a semiconductor substrate 101. The collection gate 220 may have a ring shape surrounding the floating diffusion region 210 formed in the semiconductor substrate 101. The drain gate 230 may be formed on the semiconductor substrate 101. The drain gate 230 may have a ring shape surrounding the collection gate 220. The drain region 240 may be formed in the semiconductor substrate 101 and the drain region 240 may surround the drain gate 230. Referring to FIG. 7, the unit pixel 200 may include a pinning layer 270. The pinning layer 270 may extend between the collection gate 220 and the drain gate 230.

More particularly, referring to FIG. 8, a unit pixel 200a may further include a photo-charge storing region 250 formed in a ring shape in the semiconductor substrate 101 between the floating diffusion region 210 and the drain region 240. The photo-charge storing region 250 may be doped with impurities of an opposite conductivity type to that of the semiconductor substrate 101.

In the unit pixel 100 of FIG. 2, the collection gate 120 and the drain gate 130 may be formed to cover portions of the photo-charge storing region 150, respectively. In the exemplary embodiment of FIG. 8, the collection gate 220 and the drain gate 230 do not overlap with the photo-charge storing region 250. Referring to FIG. 8, the unit pixel 200a of FIG. 8, the collection gate 220 may be formed in the ring shape between the photo-charge storing region 250 and the floating diffusion region 210, and the drain gate 230 may be formed in the ring shape between the photo-charge storing region 250 and the drain region 240.

Referring to FIG. 8, the pinning layer 270 may be formed in a ring shape in the semiconductor substrate 101. The pinning layer 270 may cover the photo-charge storing unit 250. The pinning layer 270 may be doped with impurities of an opposite conductivity type to that of the photo-charge storing unit 250. For example, the photo-charge storing unit 250 may be doped with N-type impurities, and the pinning layer 270 may be doped with P-type impurities. The pinning layer 270 may reduce dark current, and may make the electric potential more uniform throughout the photo-charge storing unit 250 by reducing effects of defects that may exist at a surface of the semiconductor substrate 101. Further, by decreasing the doping concentration of the photo-charge storing unit 250, electric potentials of the drain gate 230 and the collection gate 220 may become steep, which may result in rapid horizontal movement of photo-charges.

Compared to the unit pixel 200a of FIG. 8, a semiconductor substrate 101' of a unit pixel 200b of FIG. 9 includes a plurality of photo-charge generating regions 11, 13 and 15 that are doped with impurities of the same conductivity type and different concentrations.

For example, in a case where the semiconductor substrate 101' has P-type conductivity, the semiconductor substrate 101' may include, in order from an upper surface of the semiconductor substrate 101', a P region 11, a P− region 13 and a P+ region 15. The P− region 13 is more lightly doped than the P region 11, and the P+ region 15 is more heavily doped than the P region 11. In this case, similarly to the P+ region 15, the pinning layer 270 may be heavily doped with P-type impurities.

As described above, since the P+ region 15, which is heavily doped, is located below the P− region 13, photo-electrons generated near a boundary between the P− region 13 and the P+ region 15 may tend to move into an N-P junction portion. Accordingly, the sensitivity of the unit pixel 200b may be improved by forming the plurality of photo-charge generating regions 11, 13 and 15 that are doped with impurities of different concentrations in the semiconductor substrate 101'.

Figure 10:
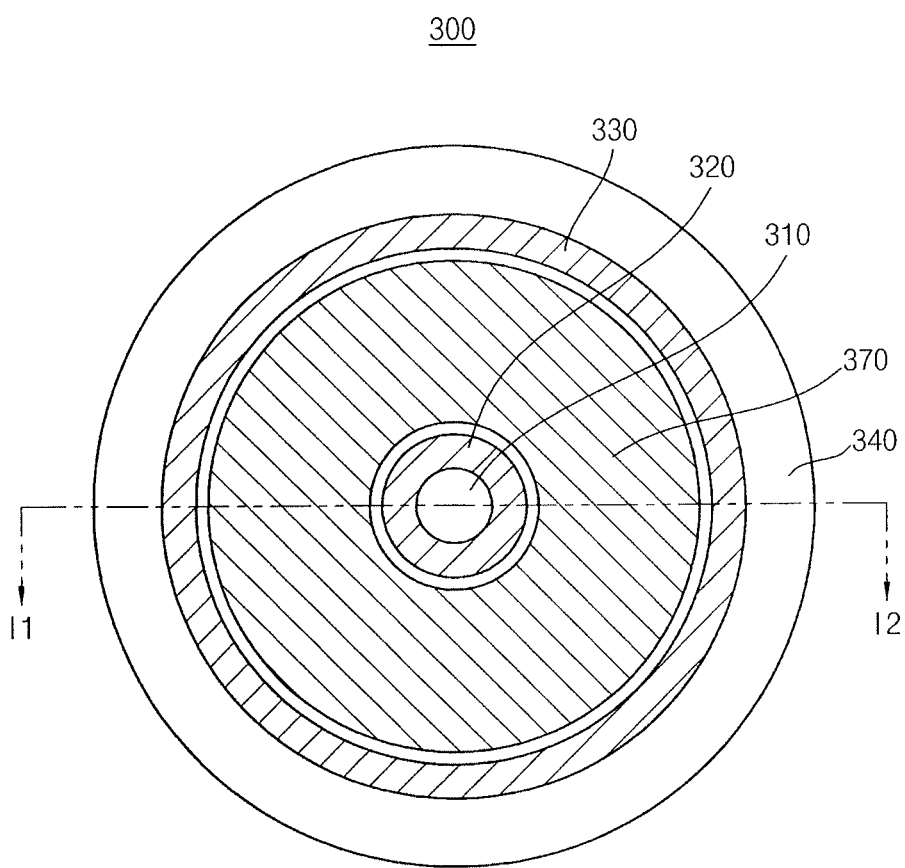
FIG. 10 illustrates a plan view of another exemplary embodiment of a unit pixel of a photo-detection device.
Figure 11:
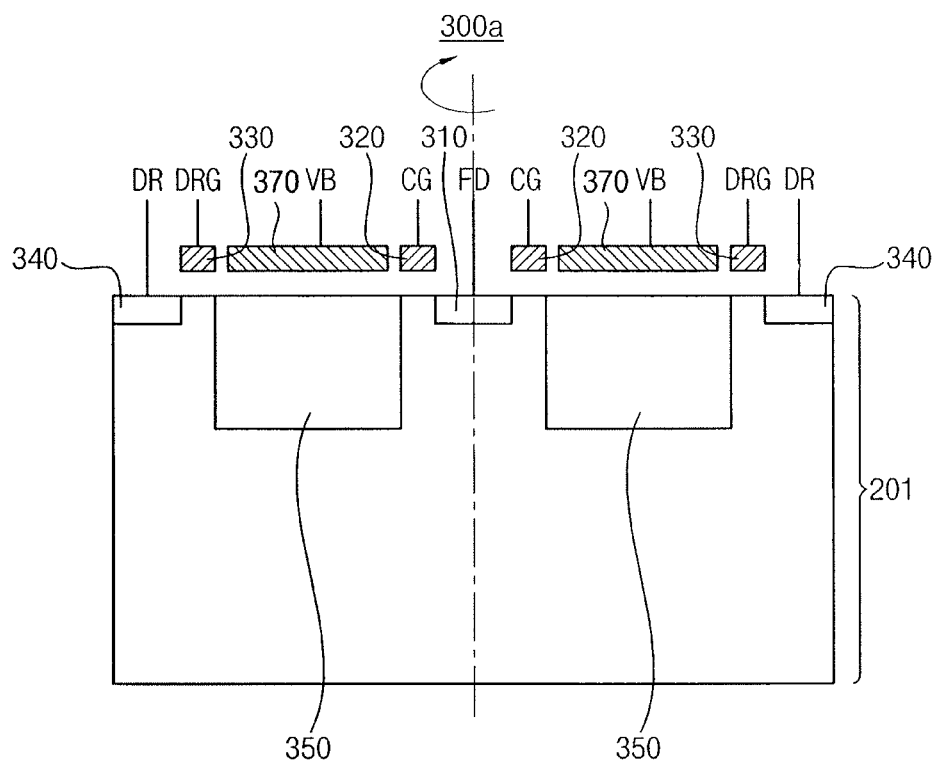
FIGS. 11 and 12 illustrate cross-sectional views of exemplary embodiments of the unit pixel of FIG. 10.
Figure 12:
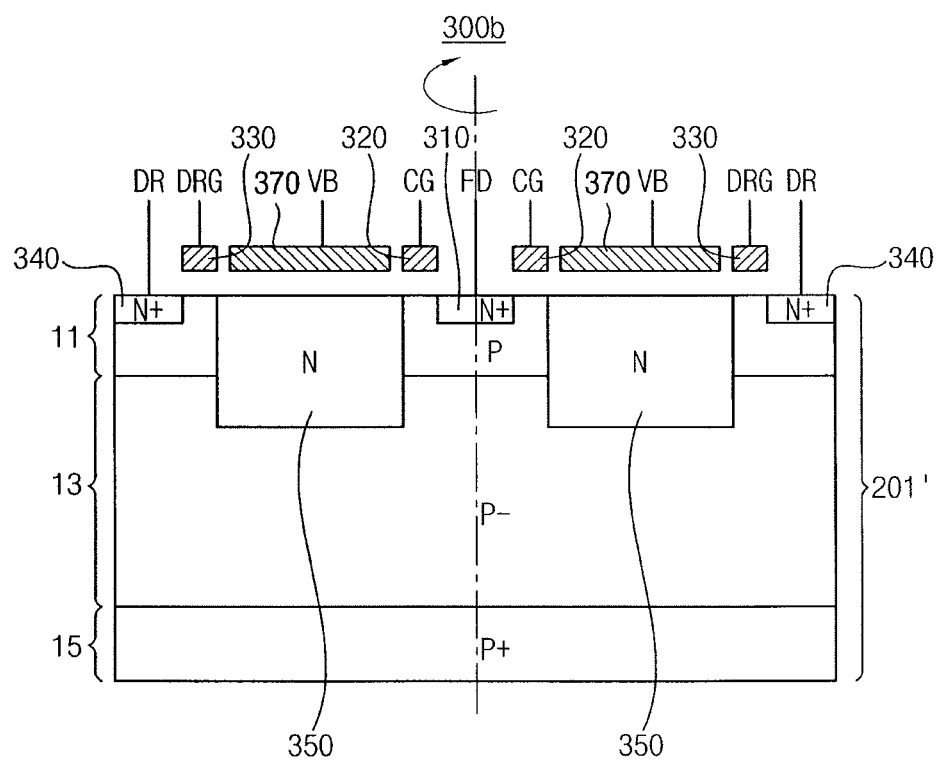

FIG. 10 illustrates a plan view of another exemplary embodiment of a unit pixel 300 of a photo-detection device. FIGS. 11 and 12 illustrate cross-sectional views of exemplary embodiments of the unit pixel 300 of FIG. 10.

Referring to FIG. 10, the unit pixel 300 may include a floating diffusion region 310, a collection gate 320, a drain gate 330, a drain region 340, and a photo gate 370. Referring to FIG. 10, similar to the unit pixel 100 of FIG. 2 and the unit pixel 200 of FIG. 7, when viewed from the top of the unit pixel 300, the collection gate 320 may be formed on a semiconductor substrate 201. The collection gate 320 may have a ring shape surrounding the floating diffusion region 310 formed in the semiconductor substrate 201. The drain gate 330 may be formed over the semiconductor substrate 201. The drain gate 330 may have a ring shape surrounding the collection gate 320. The drain region 340 may be formed in the semiconductor substrate 201. The drain region 340 may surround the drain gate 330.

As illustrated in FIG. 11, a unit pixel 300a may further include a photo-charge storing region 350. The photo-charge storing region 350 may be formed in a ring shape in the semiconductor substrate 201 between the floating diffusion region 310 and the drain region 340. The photo-charge storing region 350 may be doped with impurities of an opposite conductivity type to that of the semiconductor substrate 10.

In the unit pixel 100 of FIG. 2, the collection gate 120 and the drain gate 130 may be formed to cover portions of the photo-charge storing region 150, respectively. In the exemplary embodiment of FIG. 11, the collection gate 320 and the drain gate 330 do not overlap with the photo-charge storing region 350. In the unit pixel 300a of FIG. 11, the collection gate 320 is formed in the ring shape between the photo-charge storing region 350 and the floating diffusion region 310, and the drain gate 330 is formed in the ring shape between the photo-charge storing region 350 and the drain region 340.

Referring to FIG. 11, the unit pixel 300a may include the photo gate 370 formed in a ring shape over the semiconductor substrate 201 between the collection gate 320 and the drain gate 330 to cover the photo-charge storing unit 350. The photo gate 370 may be biased by a predetermined bias voltage VB to induce an appropriate electric potential distribution instead of a pinning layer 270 illustrated in FIG. 8. The photo gate 370 to which the bias voltage VB is applied may reduce dark current, and may make the electric potential more uniform throughout the photo-charge storing unit 350 by reducing effect of defects that may exist at a surface of the semiconductor substrate 201. Further, by decreasing the doping concentration of the photo-charge storing unit 350, electric potentials of the drain gate 330 and the collection gate 320 may become steep, which results in rapid horizontal movement of photo-charges.

Compared to the unit pixel 300a of FIG. 11, a semiconductor substrate 201' of a unit pixel 300b of FIG. 12 includes a plurality of photo-charge generating regions 11, 13 and 15 that are doped with impurities of the same conductivity type and different concentrations.

For example, in a case where the semiconductor substrate 201' has P-type conductivity, the semiconductor substrate 201' may include, in order from an upper surface of the semiconductor substrate 201', a P region 11, a P− region 13 and a P+ region 15. The P− region 13 is more lightly doped than the P region 11, and the P+ region 15 is more heavily doped than the P region 11.

As described above, since the P+ region 15, which is heavily doped, is located below the P− region 13, photo-electrons generated near a boundary between the P− region 13 and the P+ region 15 may tend to move into an N-P junction portion. One or more embodiments of the unit pixel 300*b* may enable sensitivity of the unit pixel, e.g., 300*b*, to be improved by forming the plurality of photo-charge generating regions 11, 13 and 15 that are doped with impurities of different concentrations in the semiconductor substrate 201'.

FIGS. 13 through 17 illustrate diagrams of exemplary embodiments of pixel arrays.

Figure 13:
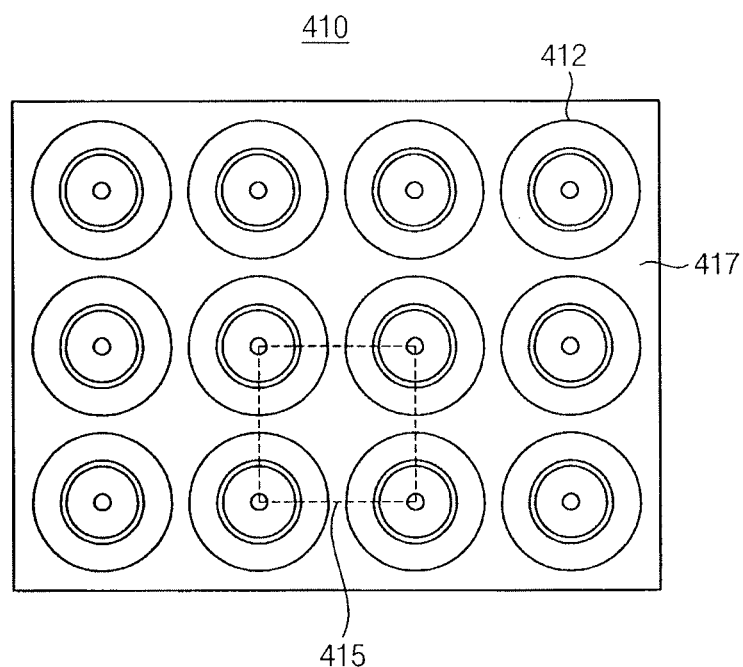
FIGS. 13 through 17 illustrate diagrams of exemplary embodiments of pixel arrays.

Referring to FIG. 13, a pixel array 410 includes a plurality of unit pixels 412 that are arranged in a rectangular grid. The unit pixels 412 may have ring-shaped structures and may correspond to the unit pixels, e.g., 100, 200, 300, described above with reference to FIGS. 1 through 12. The rectangular gird may include a square 415 that is defined by four adjacent unit pixels, and one unit pixel may be located at each grid point.

In a case where the unit pixels 412 are arranged in an array, drain regions 417 of adjacent unit pixels may be spatially coupled to each other, and may be integrally formed in a semiconductor substrate. In such embodiments, since the drain regions are integrally formed, an outer edge of a drain region may not be defined for a specific unit pixel. In the pixel array 410 including unit pixels 412 according to exemplary embodiments, since the integrated drain regions 417 perform anti-blooming, an additional anti-blooming structure may not be required.

Further, in one or more embodiments employing one or more features described above, since all drain regions may be substantially coupled to each other and each unit pixel may operate as a single-tap detector that provides one output, overall layout margin may be improved.

Figure 14:
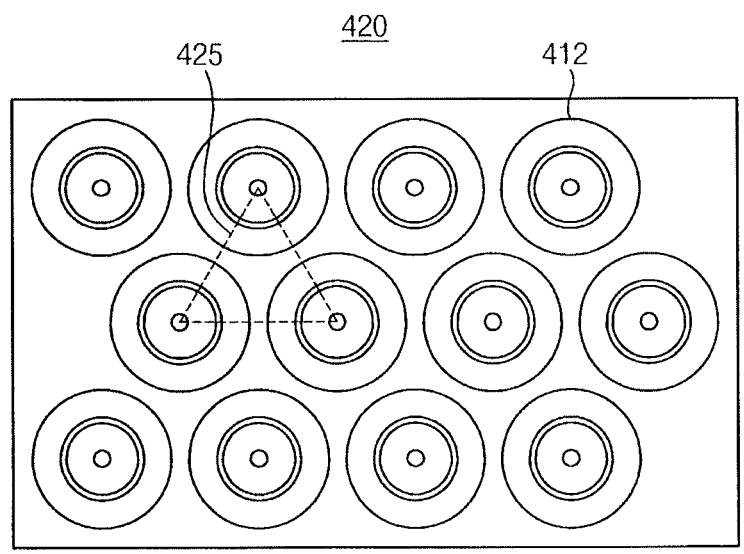

Referring to FIG. 14, a pixel array 420 includes a plurality of unit pixels 412 that are arranged in a triangular grid. The unit pixels 412 may have ring-shaped structures described above with reference to FIGS. 1 through 12. The triangular gird may include a triangle 425 that is defined by three adjacent unit pixels, and one unit pixel may be located at each grid point.

Figure 15:
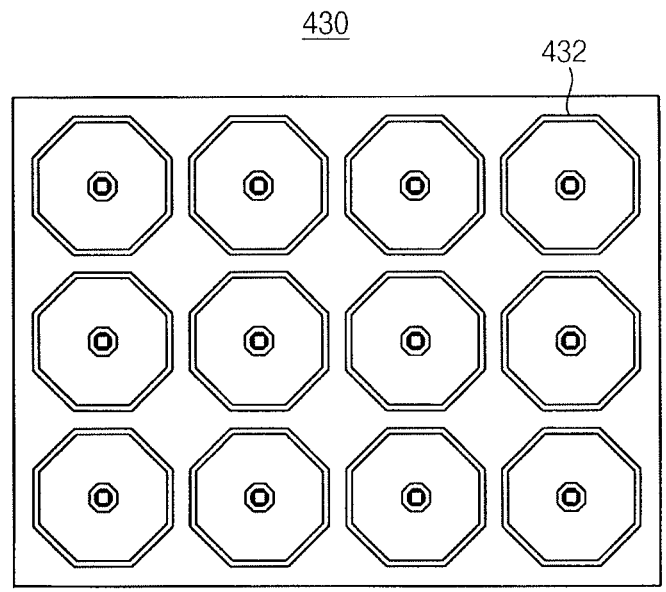

Referring to FIG. 15, a pixel array 430 includes a plurality of unit pixels 432 that are arranged in a rectangular grid. The unit pixels 432 may have ring-shaped structures described above with reference to FIGS. 1 through 12. More particularly, e.g., one or more of the unit pixels 432, as illustrated in FIG. 15, may have an octagonal ring-shaped structure.

Figure 16:
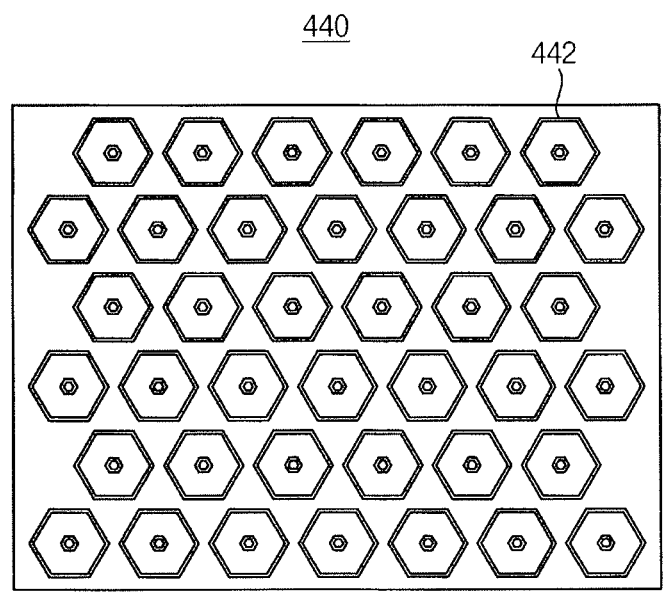

Referring to FIG. 16, a pixel array 440 includes a plurality of unit pixels 442 that are arranged in a triangular grid. The unit pixels 442 may have ring-shaped structures described above with reference to FIGS. 1 through 12. More particularly, e.g., one or more of the unit pixels 442, as illustrated in FIG. 16, may have a hexagonal ring-shaped structure.

As illustrated in FIGS. 13 through 16, a unit pixel according to exemplary embodiments may have a circular or any polygonal ring-shaped structure. For example, the unit pixel may have a rectangular ring-shaped structure. Further, unit pixels having any ring-shaped structure may be arranged in a rectangular grid or a triangular grid.

Figure 17:
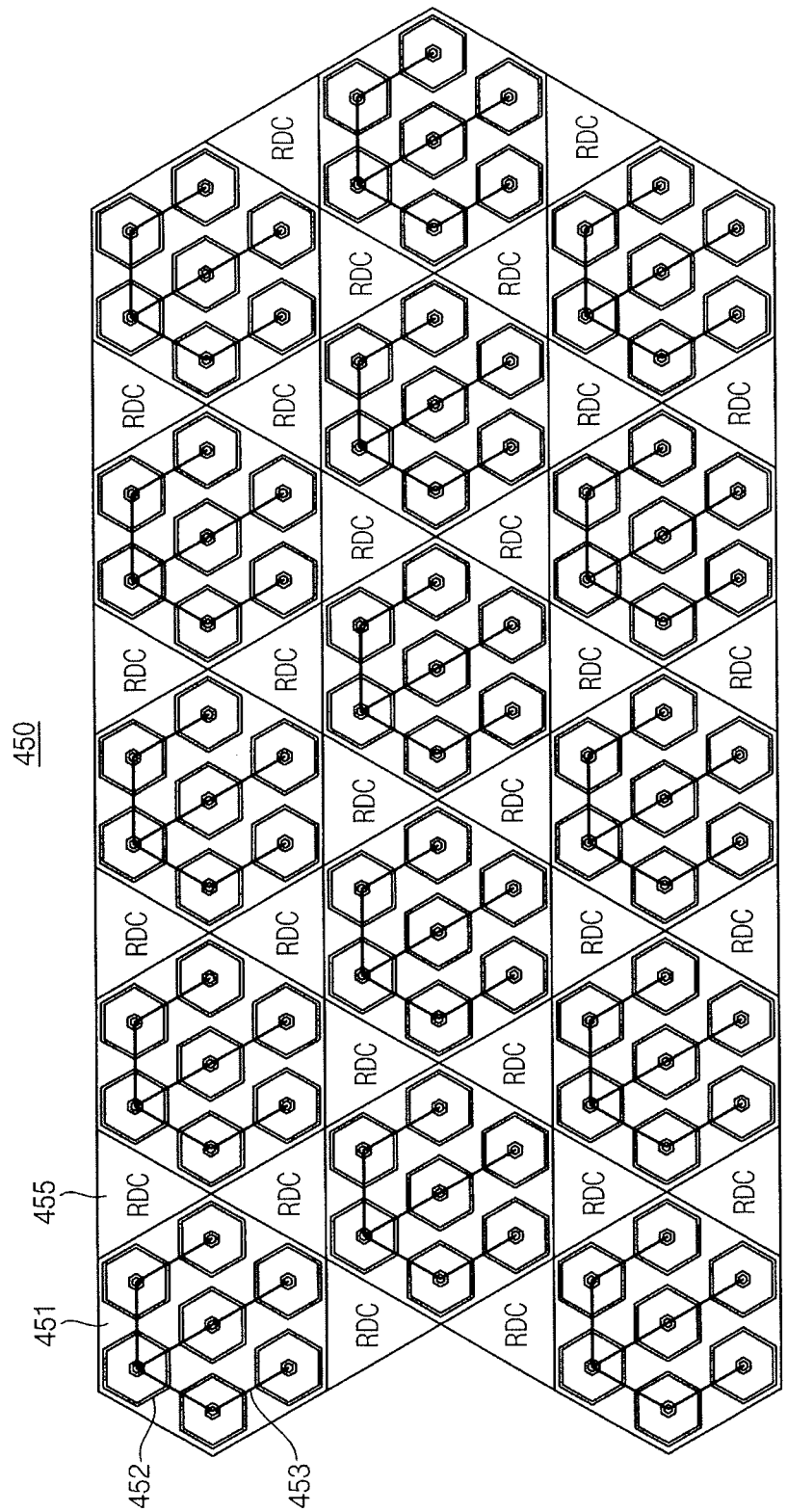

Referring to FIG. 17, a pixel array 450 includes a plurality of unit pixels 452 that are arranged in a triangular grid. In some embodiments, floating diffusion regions of two or more unit pixels included in the pixel array 450 may be electrically coupled to each other, and the two or more unit pixels may form a pixel group.

For example, as illustrated in FIG. 17, floating diffusion regions of seven unit pixels 452 may be electrically coupled to each other, and the seven unit pixels 452 may form a pixel group 451. FIG. 17 illustrates an example of the pixel array 450 where such pixel groups 451 are regularly arranged. An electrical connection 453 of the floating diffusion regions may include an interlayer connector, such as a via, that electrically couples the floating diffusion regions to an upper metal layer, and a patterned wiring in the metal layer. In one or more embodiments, by grouping the plurality of unit pixels 452 of the pixel array 450 employed, e.g., in a TOF photo-detection device, sensitivity of the TOF detection device may be improved and may have relatively high sensitivity.

In one or more embodiments, unit pixels may be regularly omitted or skipped at some grid points. More particularly, e.g., at regions RDC where the unit pixels are not located, readout circuits may be disposed to provide outputs of the unit pixels 452 or the pixel groups 451. Each readout circuit may include transistors described below with reference to FIG. 18. In one or more embodiments, as described above, since the unit pixels 452 may be grouped and the readout circuits may be efficiently disposed, overall design margin of the pixel array 450 may be improved.

Figure 18:
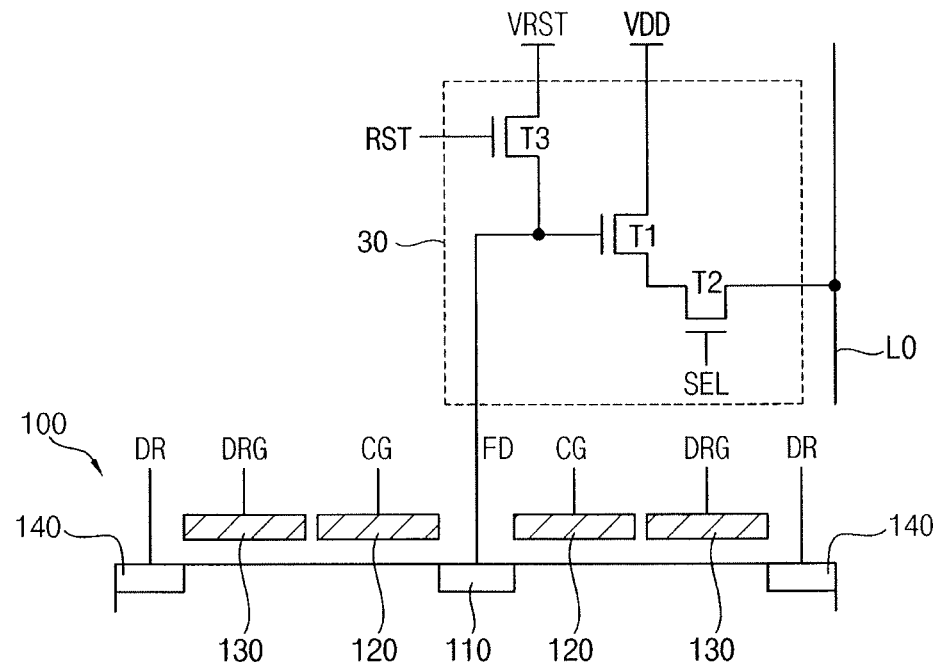
FIG. 18 illustrates a schematic diagram of an exemplary embodiment of a readout circuit for providing an output of a unit pixel.

FIG. 18 illustrates a schematic diagram of an exemplary embodiment of a readout circuit 30 for providing an output of a unit pixel, e.g., the unit pixel 100 of FIG. 2.

Referring to FIG. 18, the readout circuit 30 may be employed to read an output of a unit pixel, e.g., the unit pixel 100 of FIG. 2. More particularly, the readout circuit 30 may convert an output of the unit pixel 100 into an electrical signal. The converted output from the readout circuit 30 may be provided to an external circuit (not shown). As described above, the unit pixel 100 may have a ring-shaped structure and may operate as a single-tap detector. Further, as described above, the unit pixel 100 may include the floating diffusion region 110, the collection gate 120, the drain gate 130, and the drain region 140.

Referring to FIG. 18, the readout circuit 30 may include a source follower transistor T1, a select transistor T2 and a reset transistor T3. The reset transistor T3 may initialize a voltage FD of the floating diffusion region 110 to a reset voltage VRST in response to a reset signal RST. The floating diffusion region 110 is coupled to a gate of the source follower transistor T1. If the select transistor T2 is turned on in response to a select signal SEL after photo-charges are collected, an electrical signal corresponding to a voltage FD of the floating diffusion region 110 is provided to an external circuit via an output line LO.

As described above, the voltage FD of the floating diffusion region 110 corresponding to the output of the unit pixel 100 may be provided to the external circuit by the readout circuit 30 illustrated in FIG. 18. In one or more embodiments, the readout circuit 30 may be disposed at a region, e.g., RDC of FIG. 17, where a unit pixel is not located. Alternatively, e.g., in one or more embodiments, the readout circuit 30 may be disposed outside a pixel array.

Figure 19:
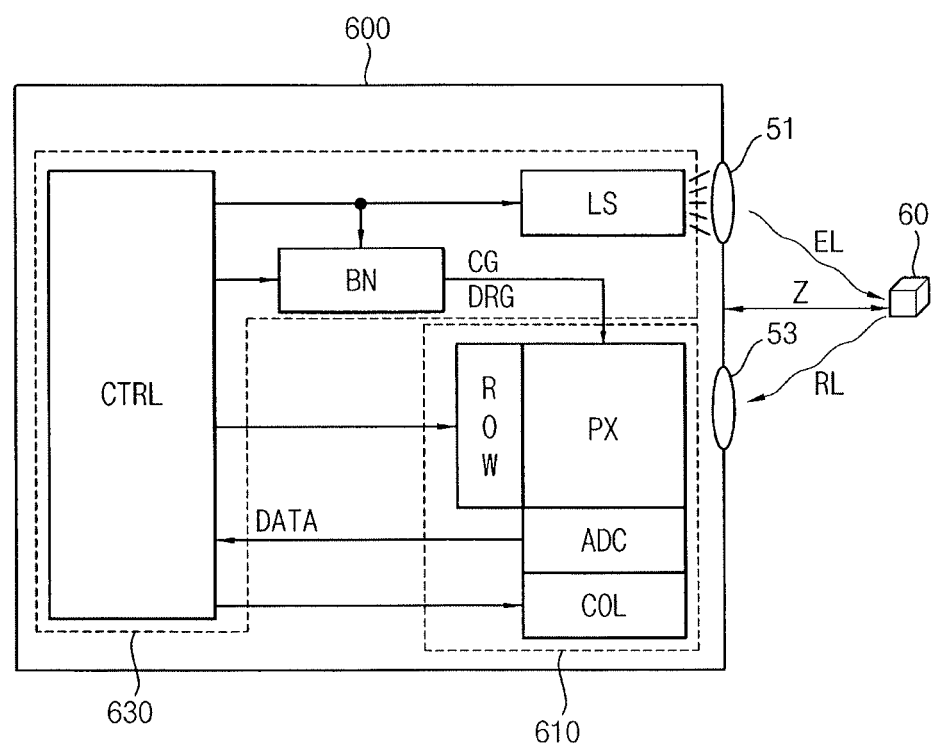
FIG. 19 illustrates a block diagram of an exemplary embodiment of a photo-detection device.

FIG. 19 illustrates a block diagram of an exemplary embodiment of a photo-detection device 600.

Referring to FIG. 19, the photo-detection device 600 may include a sensing unit 610 and a control unit 630 that controls the sensing unit 610. The sensing unit 610 may include at least one unit pixel that converts received light RL into an electrical signal DATA. The unit pixel may be a single-tap pixel of a ring-shaped structure described above with reference to FIGS. 1 through 12, e.g., the unit pixel 100, 200, 300. For example, the unit pixel may include a floating diffusion region formed in a semiconductor substrate, a ring-shaped collection gate formed over the semiconductor substrate such that the collection gate surrounds the floating diffusion region, a ring-shaped drain gate formed over the semiconductor substrate such that the drain gate surrounds the collection gate, and a drain region formed in the semiconductor substrate such that the drain region surrounds the drain gate.

The control unit 630 may include a light source LS that emits light EL to an object 60, a bin signal generator BN that generates a collection gate signal CG and a drain gate signal DRG, and a controller CTRL that controls overall operations of the photo-detection device 600.

The light source LS may emit the light EL having a predetermined wavelength. For example, the light source LS may emit infrared light or near-infrared light. The emitted light EL generated by the light source LS may be focused on the object 60 by a lens 51. The light source LS may be controlled by the controller CTRL to output the emitted light EL such that the intensity of the emitted light EL periodically changes. For example, the emitted light EL may be a pulse train signal having successive pulses. The light source LS may be implemented with a light emitting diode LED, a laser diode, or the like.

The bin signal generator BN generates the collection gate signal CG and the drain gate signal DRG for operating the ring-shaped unit pixel included in the sensing unit 610. The collection gate signal CG and the drain gate signal DRG may be complementarily activated. As described above, if the collection gate signal CG is activated, a channel is formed in a region of the semiconductor substrate under the collection gate, or in the region between the photo-charge storing region and the floating diffusion region. If the drain gate signal DRG is activated, a channel is formed in a region of the semiconductor substrate under the drain gate, or in the region between the photo-charge storing region and the drain region.

Accordingly, photo-charges generated in the semiconductor substrate are collected in the floating diffusion region while the collection gate signal CG is activated, and the photo-charges generated in the semiconductor substrate are drained into the drain region while the drain gate signal DRG is activated.

As will be described below, the collection gate signal CG may include a plurality of bin signals CGi of which the numbers of cycles increase according to phase differences with respect to the emitted light EL, the photo-detection device 600 may obtain depth information by converting, into an electrical signal, the received light RL that has been reflected by the object 60 and enters the sensing unit 610 through a lens 53.

In one or more embodiments, the sensing unit 610 may include a unit pixel (or a pixel group) described above, and an analog-digital converting unit ADC for converting an output of the unit pixel into a digital signal.

In one or more embodiments, the sensing unit 610 may include a pixel array PX including a plurality of unit pixels (or a plurality of pixel groups) arranged in an array. In such embodiments, the sensing unit 610 may include the analog-digital converting unit ADC, and a select circuit ROW, COL for selecting a particular unit pixel in the pixel array PX.

In one or more embodiments, the analog-digital converting unit ADC may perform column analog-digital conversion that converts analog signals in parallel using a plurality of analog-digital converters respectively coupled to a plurality of column lines, or may perform single analog-digital conversion that converts the analog signals in series using a single analog-digital converter.

In one or more embodiments, the analog-digital converting unit ADC may include a correlated double sampling (CDS) unit for extracting an effective signal component.

In some embodiments, the CDS unit may perform analog double sampling (ADS) that extracts the effective signal component based on an analog reset signal that represents a reset component and an analog data signal that represents a signal component.

In other embodiments, the CDS unit may perform digital double sampling (DDS) that converts the analog reset signal and the analog data signal into two digital signals to extract as the effective signal component a difference between the two digital signals.

In still other embodiments, the CDS unit may perform dual correlated double sampling that performs both of analog double sampling and digital double sampling.

Figure 20:
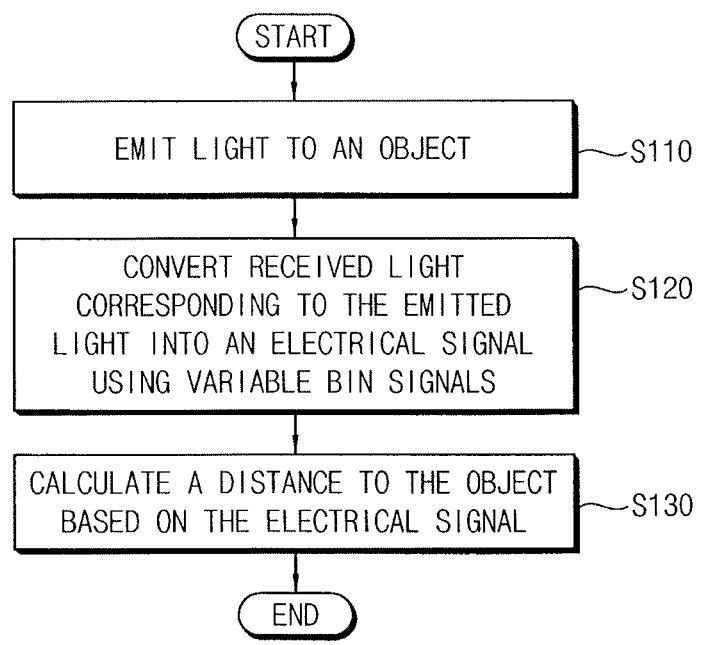
FIG. 20 illustrates a flow chart of an exemplary embodiment of a method of measuring a distance.

FIG. 20 illustrates a flow chart of an exemplary embodiment of a method of measuring a distance.

Referring to FIGS. 19 and 20, the light source LS emits light EL to an object 60 (S110). The sensing unit 610 converts received light RL, which has been reflected by the object 60 and enters the sensing unit 610, into an electrical signal using a plurality of variable bin signals of which the numbers of cycles increase according to phase differences with respect to the emitted light EL (S120). The plurality of variable bin signals may be included in complementary gate signals CG and DRG generated by a bin signal generator BN. The collection gate signal CG and the drain gate signal DG including the plurality of variable bin signals will be described in detail below with reference to FIGS. 21 through 25. The controller CTRL calculates a distance to the object 60 based on a data signal DATA provided from the sensing unit 610 (S130).

Figure 21:
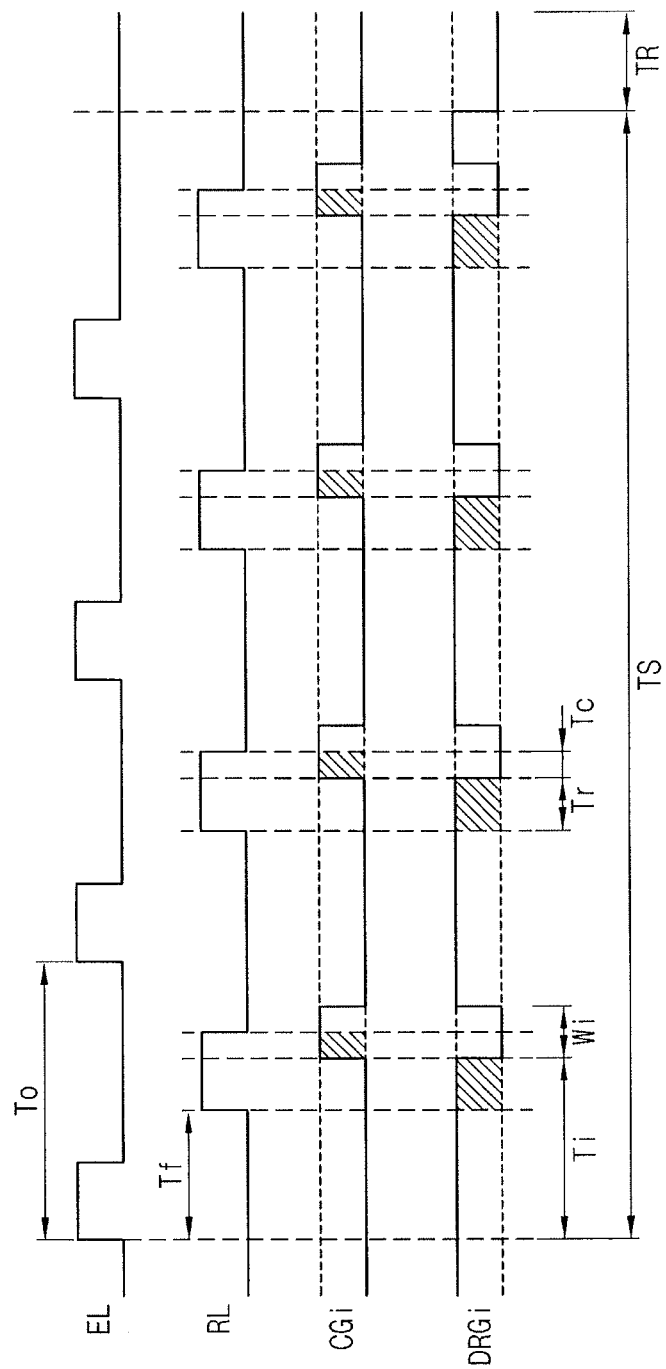
FIG. 21 illustrates an exemplary timing diagram of exemplary signals employable for converting received light into an electrical signal.

FIG. 21 illustrates an exemplary embodiment of a timing diagram for describing signals for converting received light into an electrical signal.

Referring to FIG. 21, the emitted light EL generated by the light source LS of the photo-detection device 600 may be a pulse train signal that includes pulses of a predetermined period To. The emitted light EL is reflected by the object 60 located at a distance Z, and reaches the photo-detection device 600 as the received light RL. The distance Z from the photo-detection device 600 to the object 60 may be calculated using an equation expressed as "Tf=2Z/C", where C represents speed of light, and Tf represents a phase difference between the emitted light EL and the received light RL.

A plurality of bin signals may be used to obtain the phase difference Tf between the emitted light EL and the received light RL. FIG. 21 illustrates one bin signal CGi having a phase difference Ti with respect to the emitted light EL and an activation duration Wi per period To. Relations among a plurality of bin signals will be described below with reference to FIGS. 22 and 23. For example, the bin signal CGi and an inverted bin signal DRGi may be used as gate signals of a unit pixel 100 described above with reference to FIGS. 2 through 6.

The bin signal CGi may be applied to the collection gate 120 as a collection gate signal CG, and the inverted bin signal DRGi may be applied to the drain gate 130 as a drain gate signal DRG. While photo-charges are generated in response to the received light RL in the semiconductor substrate 10, the generated photo-charges are drained into the drain region 140 during a first time Tr, and the generated photo-charges are collected in the floating diffusion region 110 during a second time Tc.

Such rejection and collection of the photo-charges are repeated the number of times corresponding to the number of cycles included in the bin signal CGi during a sensing time TS. The amount of the photo-charges collected in the floating diffusion region 110 may then be output by the readout circuit 30 illustrated in FIG. 18 during a readout time TR.

Figure 22:
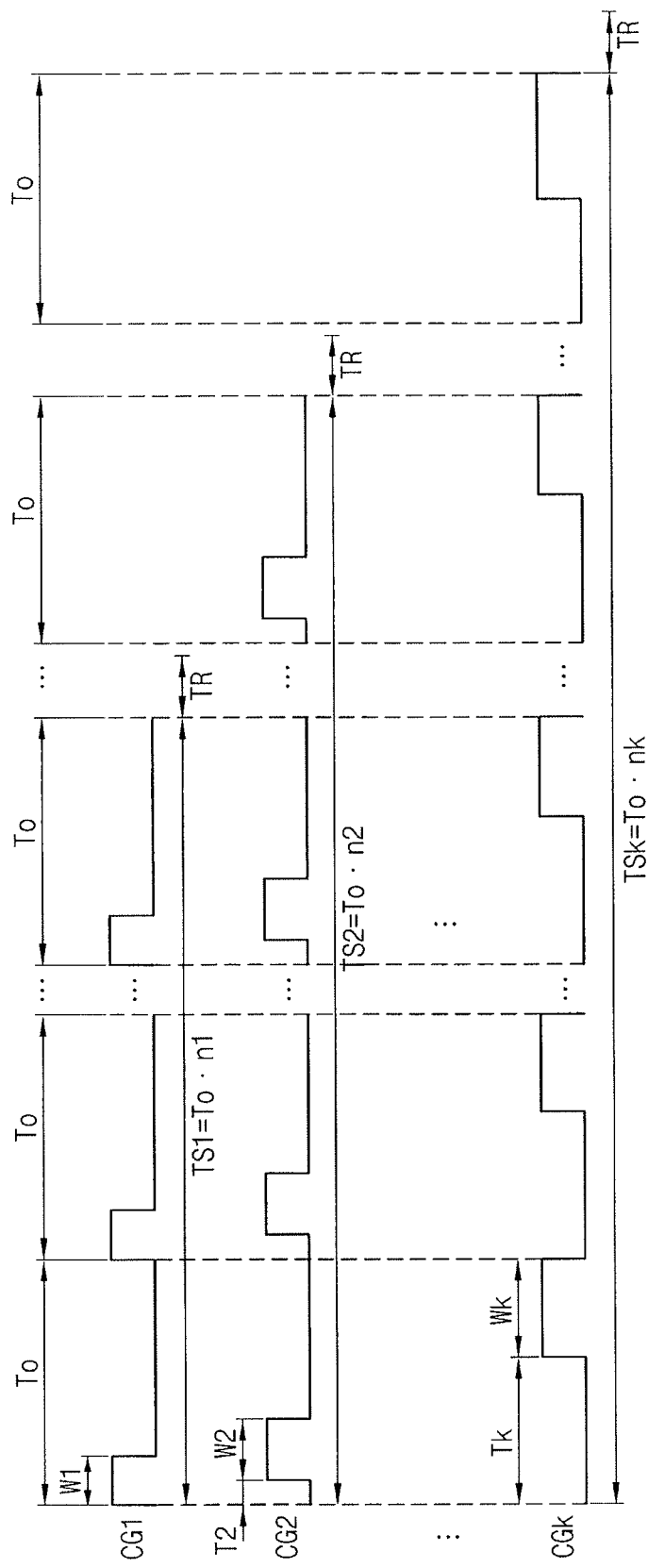
FIGS. 22 and 23 illustrate exemplary timing diagrams of examples of variable bin signals employable by the method of measuring a distance illustrated in FIG. 20.
Figure 23:
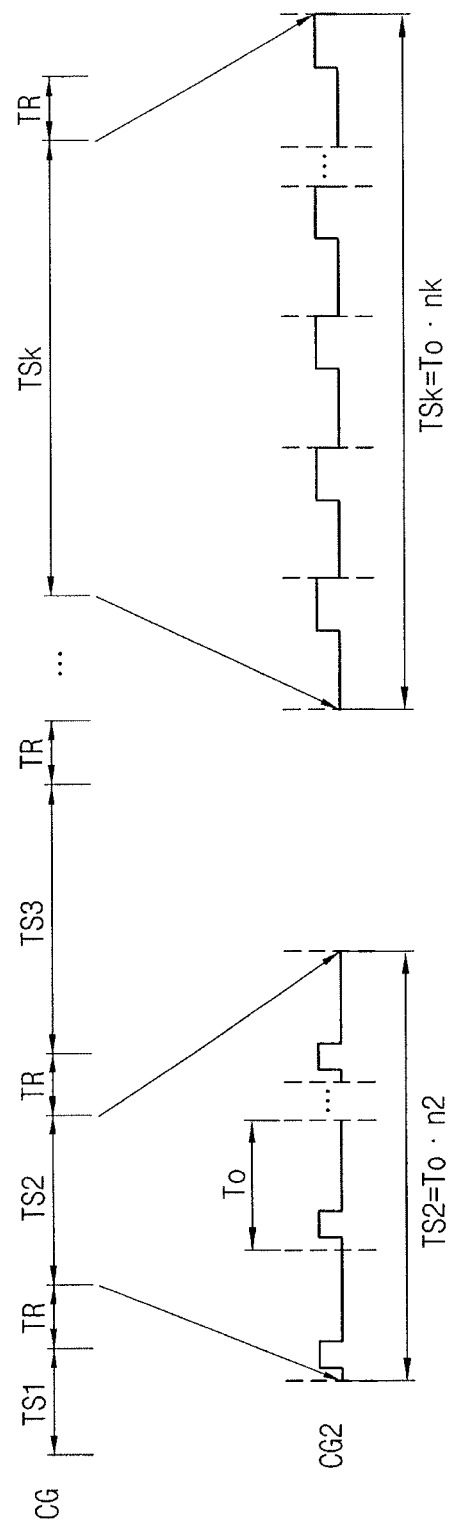

FIGS. 22 and 23 illustrate exemplary timing diagrams of examples of variable bin signals employable by the method of measuring a distance illustrated in FIG. 20.

Referring to FIG. 22, a plurality of variable bin signals CG1, CG2, . . . , CGk have the numbers of cycles that increase according to phase differences T2, . . . , Tk with respect to an emitted light EL. For example, a first bin signal CG1 having a phase difference of 0 with respect to the emitted light EL may have the lowest number of cycles, the numbers of cycles may gradually increase as the phase differences with respect to the emitted light EL increase, and a k-th bin signal CGk having the largest phase difference with respect to the emitted light EL may have the highest number of cycles. In other words, a first sensing time TS1 (=To*n1) using the first bin signal CG1 is shortest, and a k-th sensing time TSk (=To*nk) using the k-th bin signal CGk is longest.

As a distance Z from a photo-detection device 600 to an object 60 increases, or as a phase difference Tf between emitted light EL and received light RL increases, the intensity of the received light RL decreases inversely proportional to a square of the distance Z. Accordingly, as described above, since the numbers of cycles included in the plurality of bin signals CGi increase according to the phase differences Ti with respect to the emitted light EL, the sensing times TSi may be increased as the distance Z to the object 60 increases, which results in the improvement of the signal-to-noise ratio (SNR). Further, a dynamic range of the photo-detection device 600 may be improved by applying such a gain depending on the distance Z.

In some embodiments, the plurality of bin signals CGi may vary such that duty ratios (Wi/To) increase according to the phase differences Ti with respect to the emitted light EL. That is, the activation durations Wi of the plurality of bin signals CGi per period To may increase according to the phase differences Ti with respect to the emitted light EL.

In general, as the distance Z to the object 60 increases, the necessity for accuracy of the distance Z may decrease. Thus, the activation durations Wi of the plurality of bin signals CGi may be increased according to the distance Z to increase the gain, thereby improving the signal-to-noise ratio.

The plurality of bin signals CGi illustrated in FIG. 22 may be applied to different unit pixels, respectively. For example, in a case where a plurality of unit pixels are arranged in an array having a plurality of rows and a plurality of columns, the same bin signal may be applied to the same row of unit pixels, and different bin signals may be applied to different rows of unit pixels. In this case, respective sensing times TS1 may be substantially immediately followed by corresponding readout times TR, and thus an efficient rolling frame operation may be performed in an image sensor.

FIG. 23 illustrates an exemplary timing diagram of an example where a plurality of variable bin signals CGi are applied to one unit pixel. For convenience, only two bin signals CG2 and CGk are enlarged in FIG. 23, features of other bin signals may be similar. That is, a plurality of variable bin signals CGi has the numbers ni of cycles increasing according to phase differences Ti with respect to emitted light EL. Thus, a first sensing time TS1 (=To*n1) using the first bin signal CG1 having the smallest phase difference T1 with respect to the emitted light EL is shortest, and a k-th sensing time TSk (=To*nk) using the k-th bin signal CGk having the largest phase difference T1 with respect to the emitted light EL is longest. As described above, the plurality of bin signals CGi may vary such that duty ratios (Wi/To) increase according to the phase differences Ti with respect to the emitted light EL. In the case where the plurality of bin signals CGi are applied to one unit pixel, respective sensing times TSi may be substantially immediately followed by corresponding readout times TR, respectively.

Figures 24, 25:
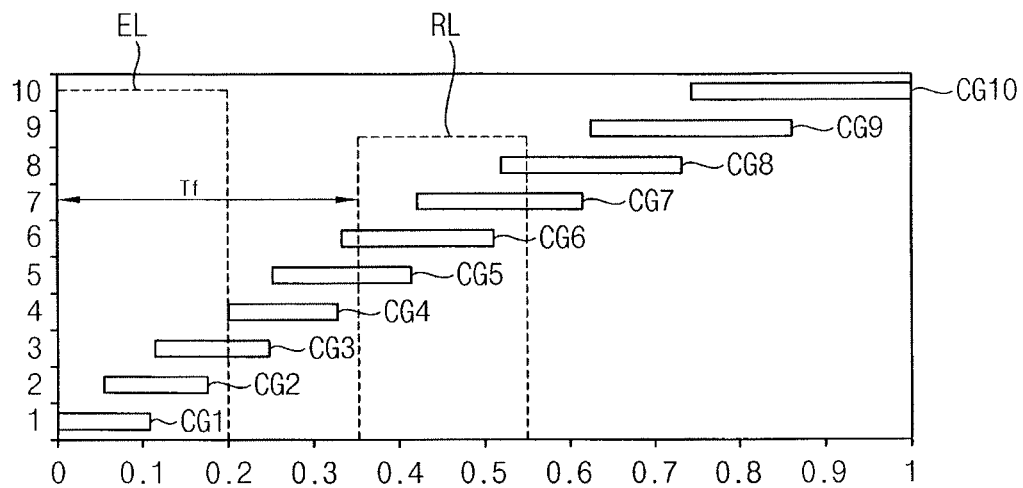
FIG. 24 illustrates a diagram of exemplary variable bin signals.
FIG. 25 illustrates a chart of exemplary phases, lengths of activation durations and the numbers of cycles of variable bin signals illustrated in FIG. 24.

FIG. 24 illustrates a diagram of exemplary variable bin signals. FIG. 25 illustrates a chart of exemplary phases, lengths of activation durations and the numbers of cycles of variable bin signals illustrated in FIG. 24.

More particularly, FIG. 24 illustrates an example of a plurality of variable bin signals CG1 through CG10 employable for measuring a phase difference Tf between emitted light EL and received light RL. For example, in a case where a three-dimensional image sensor providing depth information as well as moving image information operates at 30 fps, a pulse train signal including about thirty million optical pulses with a duty ratio of about 20% may be used as the emitted light EL. In such embodiments, e.g., when neglecting the readout time, the number of cycles of the emitted light EL corresponding to one frame may be about one million. In FIG. 24, a width of each bin signal CGi may represent an activation duration Wi. As illustrated in FIG. 24, activation durations of adjacent bin signals may overlap each other.

For example, about 50% of an activation duration W2 of a second bin signal CG2 may overlap an activation duration W3 of a third bin signal CG3, and the activation duration W3 of the third bin signal CG3 may increase by about 10% with respect to the activation duration W2 of the second bin signal CG2. Examples of the time differences Ti, the activation durations Wi, and the numbers ni of cycles of the variable bin signals CGi are illustrated in FIG. 25. In FIG. 25, M represents the sum of the numbers ni of all cycles.

As described above, photo-charges may be collected using the variable bin signals CGi, and the distance Z to the object may be calculated based on the amount of the collected photo-charges and the phases of the variable bin signals CGi.

Figure 26:
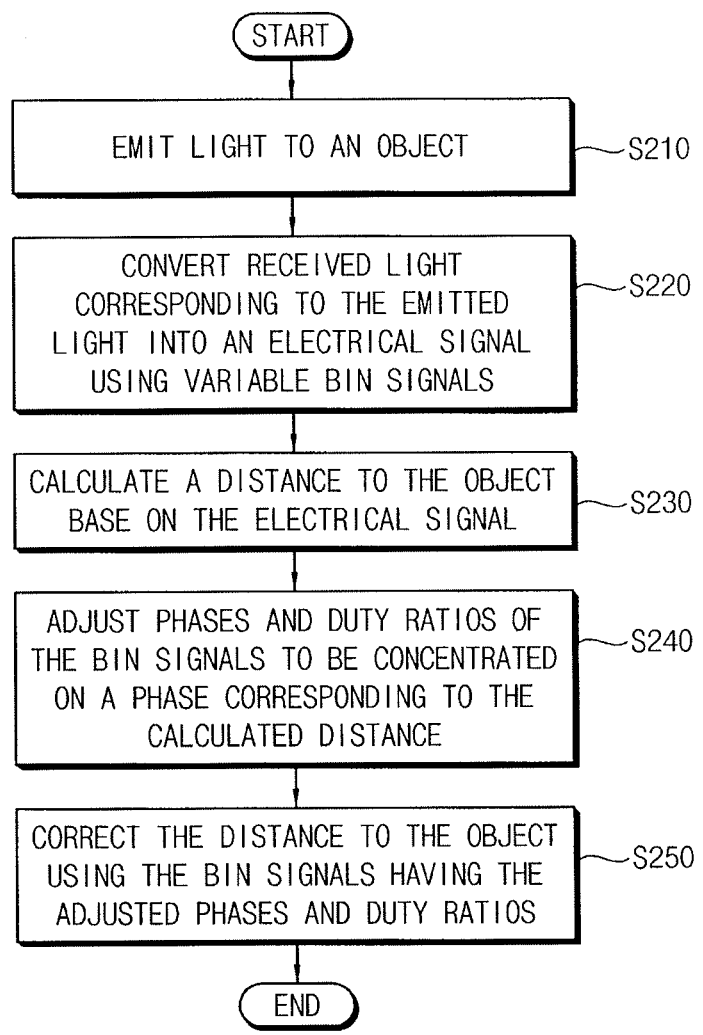
FIG. 26 illustrates a flow chart of an exemplary embodiment of a method of measuring a distance.

FIG. 26 illustrates a flow chart of an exemplary embodiment of a method of measuring a distance.

Referring to FIGS. 19 and 26, the light source LS emits light EL to the object 60 (S210). The sensing unit 610 converts received light RL, which has been reflected by the object 60 and enters the sensing unit 610, into an electrical signal using variable bin signals (S220). As described above, the numbers of cycles included in the variable bin signals may increase according to phase differences with respect to the emitted light EL. Further, duty ratios of the variable bin signals may increase according to the phase differences with respect to the emitted light EL. A controller CTRL calculates a distance to the object 60 based on a data signal DATA provided from the sensing unit 610 (S230). The controller CTRL controls a bin signal generator BN to adjust phases and duty ratios of the bin signals to be concentrated on a phase corresponding to the calculated distance (S240). The distance to the object may be corrected using a plurality of bin signals having adjusted phases and duty ratios (S250).

Figures 27, 28:
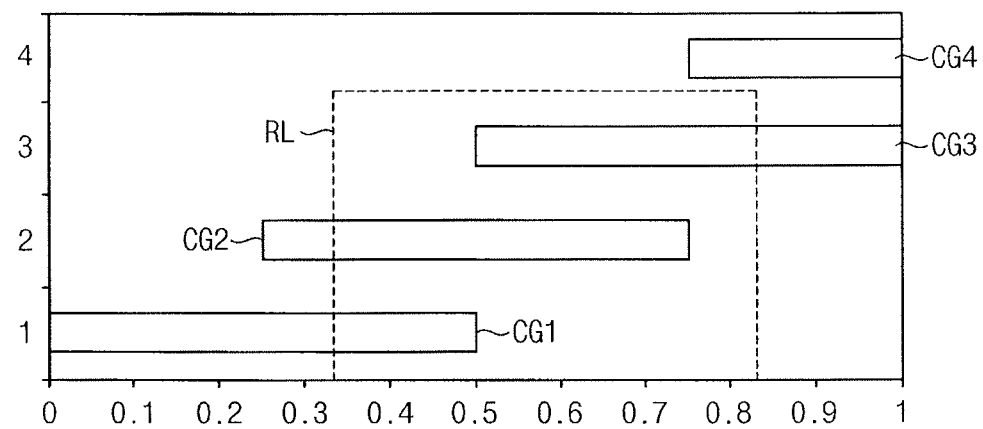
FIG. 27 illustrates a diagram of exemplary variable bin signals.
FIG. 28 illustrates a diagram of exemplary phases, lengths of activation durations and the numbers of cycles of variable bin signals illustrated in FIG. 27.
Figure 29:
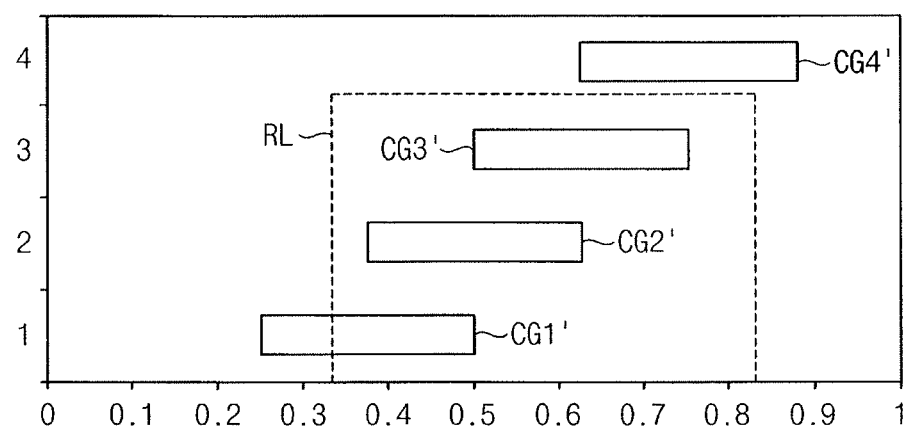
FIG. 29 illustrates a diagram of exemplary adjusted bin signals.

FIG. 27 illustrates a diagram of exemplary variable bin signals. FIG. 28 illustrates a diagram of exemplary phases, lengths of activation durations and the numbers of cycles of variable bin signals illustrated in FIG. 27. FIG. 29 illustrates a diagram of exemplary adjusted bin signals.

More particularly, FIG. 27 illustrates an example of four variable bin signals CG1, CG2, CG3 and CG4 employable for measuring a phase difference Tf between emitted light EL and received light RL. In FIG. 27, an example of the received light RL is illustrated as a dotted line in a case where the emitted light EL having a duty ratio of about 50% is used. Examples of the time differences Ti, the activation durations Wi and the numbers ni of cycles of the four bin signals CG1, CG2, CG3 and CG4 are illustrated in FIG. 28. As illustrated in FIGS. 27 and 28, the four bin signals CG1, CG2, CG3 and CG4 may have the same activation duration Wi, and the numbers ni of cycles increasing according to the phase differences Ti with respect to the emitted light EL.

A controller CTRL may calculate a distance to an object 60 based on an electrical signal DATA provided from a sensing unit 610 using such bin signals CGi, and may control a bin signal generator BN to adjust phases and duty ratios of the bin signals CGi to be concentrated on a phase corresponding to the calculated distance. FIG. 29 illustrates an example of the bin signals CGi' that are adjusted in this manner.

As illustrated in FIG. 29, more accurate data may be obtained and the distance Z to the object may be accurately corrected by using the bin signals CGi' that are adjusted to be concentrated on a pulse of the received light RL. For example, in a face recognition security system, an average distance to a face may be measured using bin signals CGi of FIGS. 27 and 28, and the face may be again scanned around the average distance using bin signals CGi' of FIG. 29 that are adjusted based on the measurement result.

Figure 30:
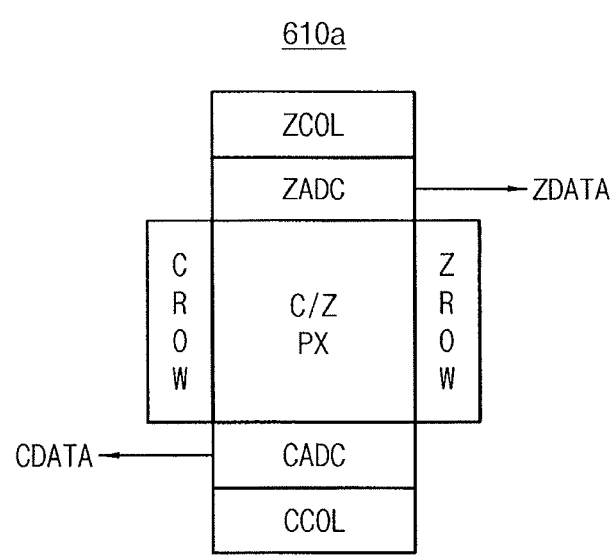
FIG. 30 illustrates a diagram of an exemplary embodiment of a sensing unit of a three-dimensional image sensor.

FIG. 30 illustrates a diagram of an exemplary embodiment of a sensing unit of a three-dimensional image sensor. More particularly, FIG. 30 illustrates an example of a sensing unit 610a in a case where a photo-detection device 600 of FIG. 19 is a three-dimensional image sensor.

Referring to FIG. 30, the sensing unit 610a may include a pixel array C/Z PX where a plurality of color pixels and a plurality of depth pixels are arranged, a color pixel select circuit CROW and CCOL, a depth pixel select circuit ZROW and ZCOL, a color pixel converter CADC and a depth pixel converter ZADC. The color pixel select circuit CROW and CCOL and the color pixel converter CADC may provide image information CDATA by controlling the color pixels included in the pixel array C/Z PX, and the depth pixel select circuit ZROW and ZCOL and the depth pixel converter ZADC may provide depth information ZDATA by controlling the depth pixels included in the pixel array C/Z PX.

As described above, in the three-dimensional image sensor, components for controlling the color pixels and components for controlling the depth pixels may independently operate to provide the color data CDATA and the depth data ZDATA of an image.

Figure 31:
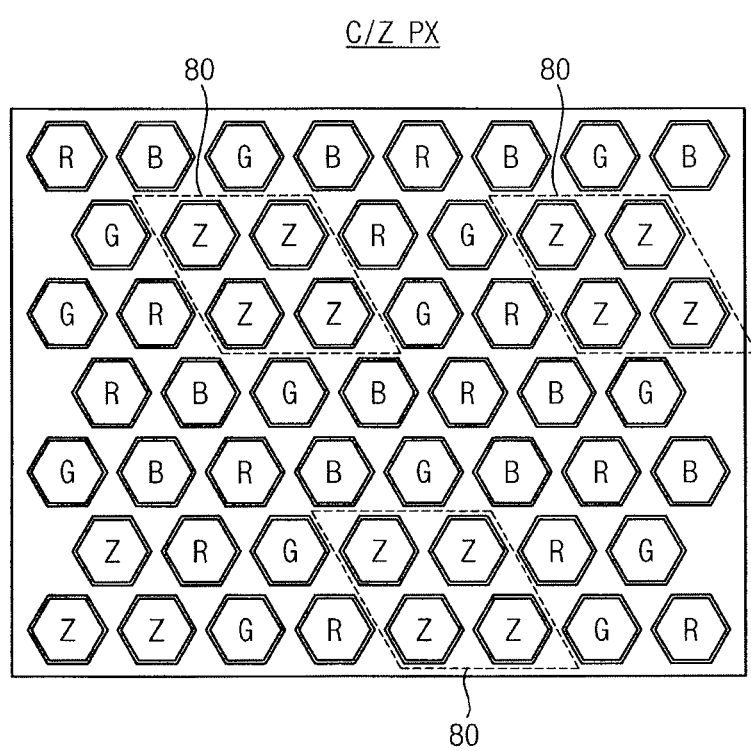
FIG. 31 illustrates a diagram of an exemplary embodiment of a pixel array employable in the sensing unit of FIG. 30.

FIG. 31 illustrates a diagram of an exemplary embodiment of a pixel array employable in the sensing unit of FIG. 30.

Referring to FIG. 31, a pixel array C/Z PX includes a plurality of unit pixels R, G, B and Z that are arranged in a triangular grid. The unit pixels R, G, B, and Z may have ring-shaped structures described above with reference to FIGS. 2 through 12. The unit pixels R, G, B, and Z include a plurality of color pixels R, G, and B and a plurality of depth pixels Z. The color pixels R, G and B may include green pixels G, red pixels R and blue pixels B. As illustrated in FIG. 31, the color pixels R, G, and B may perform the photo-detection on a unit pixel basis to improve the resolution, and the depth pixels Z may perform the photo-detection on a pixel group basis to improve the sensitivity. For example, as described above, floating diffusion regions of four depth pixels Z included in one pixel group 80 may be electrically coupled to each other, and the four depth pixels Z of one pixel group 80 may integrally operate.

The color pixel select circuit CROW and CCOL and the color pixel converter CADC may perform a sensing operation and a readout operation for the color pixels R, G and B, and the depth pixel select circuit ZROW and ZCOL and the depth pixel converter ZADC may perform a sensing operation and a readout operation for the depth pixels Z. A plurality of variable bin signals CGi described above may be applied to gates of the depth pixels Z to obtain data ZDATA representing depth information. The color pixels R, G and B and the depth pixels Z may operate at different frequencies in response to different gate signals.

Figure 32:
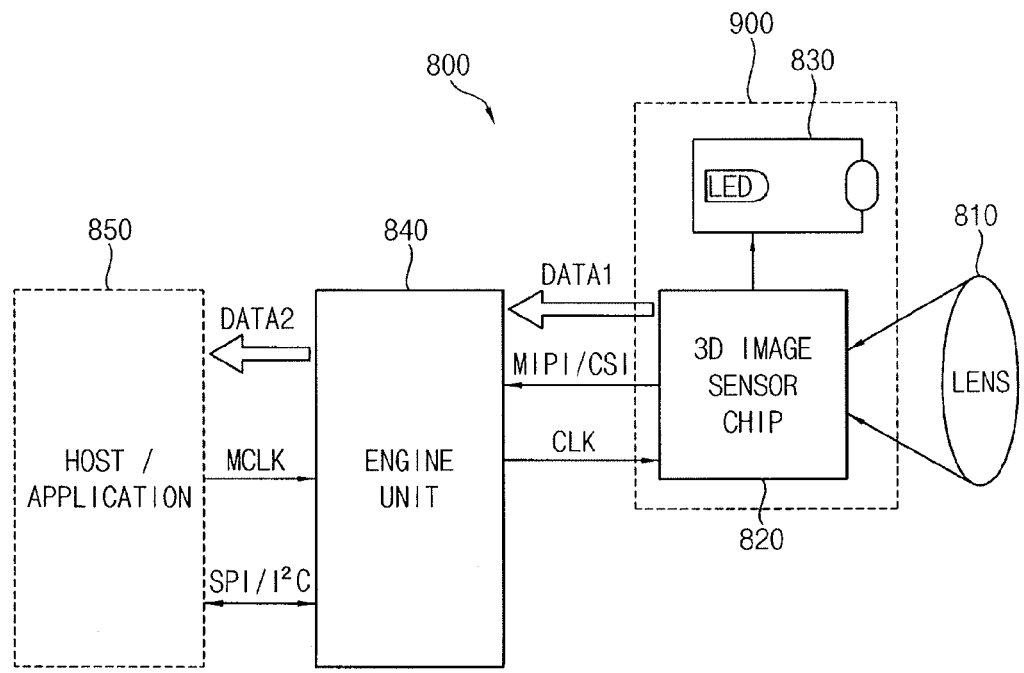
FIG. 32 illustrates a block diagram of an exemplary embodiment of a camera including a three-dimensional image sensor.

FIG. 32 illustrates a block diagram of an exemplary embodiment of a camera including a three-dimensional image sensor.

Referring to FIG. 32, a camera 800 includes a photo-receiving lens 810, a three-dimensional image sensor 900 and an engine unit 840. The three-dimensional image sensor 900 may include a three-dimensional image sensor chip 820 and a light source module 830. According to embodiments, the three-dimensional image sensor chip 820 and the light source module 830 may be implemented with separated devices, or at least a portion of the light source module 830 may be included in the three-dimensional image sensor chip 820. In some embodiments, the photo-receiving lens 810 may be included in the three-dimensional image sensor chip 820.

The photo-receiving lens 810 may focus incident light on a photo-receiving region (e.g., depth pixels and/or color pixels included in a pixel array) of the three-dimensional image sensor chip 820. The three-dimensional image sensor chip 820 may generate data DATA1 including depth information and/or color image information based on the incident light passing through the photo-receiving lens 810. For example, the data DATA 1 generated by the three-dimensional image sensor chip 820 may include depth data generated using infrared light or near-infrared light emitted from the light source module 830 and RGB data of a Bayer pattern generated using external visible light. The three-dimensional image sensor chip 820 may provide the data DATA1 to the engine unit 840 based on a clock signal CLK. In some embodiments, the three-dimensional image sensor chip 820 may interface with the engine unit 840 via mobile industry processor interface MIPI and/or camera serial interface CSI.

The engine unit 840 controls the three-dimensional image sensor 900. The engine unit 840 may process the data DATA1 received from the three-dimensional image sensor chip 820. For example, the engine unit 840 may generate three-dimensional color data based on the data DATA1 received from the three-dimensional image sensor chip 820. In other examples, the engine unit 840 may generate YUV data including a luminance component, a blue-luminance difference component, and a red-luminance difference component based on the RGB data included in the data DATA1, or compressed data, such as joint photography experts group (JPEG) data. The engine unit 840 may be connected to a host/application 850 and may provide data DATA2 to the host/application 850 based on a master clock MCLK. Further, the engine unit 840 may interface with the host/application 850 via serial peripheral interface (SPI) and/or inter integrated circuit (I2C).

Figure 33:
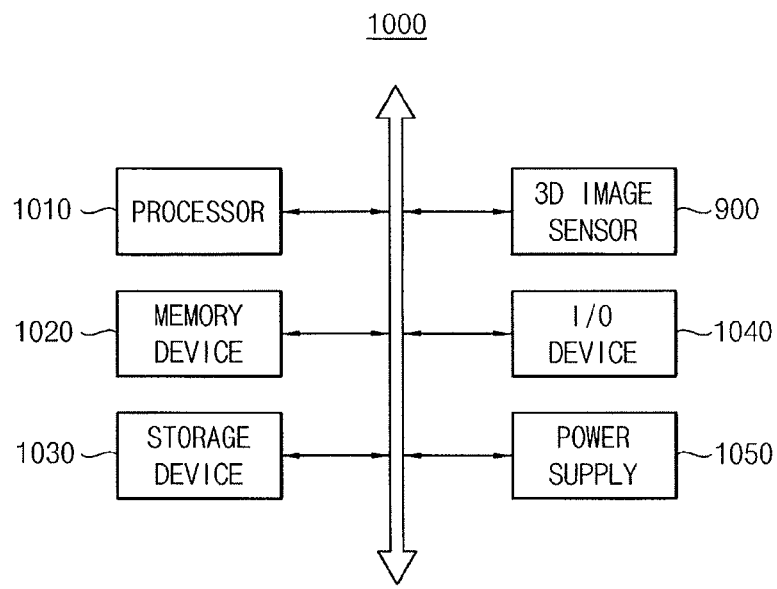
FIG. 33 illustrates a block diagram of an exemplary embodiment of a computing system including a three-dimensional image sensor.

FIG. 33 illustrates a block diagram of an exemplary embodiment of an interface employable in the computing system of FIG. 33.

Referring to FIG. 33, a computing system 1000 may include a processor 1010, a memory device 1020, a storage device 1030, an input/output device 1040, a power supply 1050 and a three-dimensional image sensor 900. Although it is not illustrated in FIG. 33, the computing system 1000 may further include ports that communicate with a video card, a sound card, a memory card, a USB device, or other electronic devices.

The processor 1010 may perform various calculations or tasks. According to embodiments, the processor 1010 may be a microprocessor or a CPU. The processor 1010 may communicate with the memory device 1020, the storage device 1030 and the input/output device 1040 via an address bus, a control bus, and/or a data bus. In some embodiments, the processor 1010 may be coupled to an extended bus, such as a peripheral component interconnection (PCI) bus. The memory device 1020 may store data for operating the computing system 1000. For example, the memory device 1020 may be implemented with a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device. The storage device may include a solid state drive (SSD), a hard disk drive (HDD), a CD-ROM, etc. The input/output device 1040 may include an input device (e.g., a keyboard, a keypad, a mouse, etc.) and an output device (e.g., a printer, a display device, etc.). The power supply 1050 supplies operation voltages for the computing system 1000.

The three-dimensional image sensor 900 may communicate with the processor 1010 via the buses or other communication links. As described above, the three-dimensional image sensor 900 may include a unit pixel having a ring-shaped structure, which operates as a single-tap detector. Further, as described above, the three-dimensional image sensor 900 may use a plurality of variable bin signals to measure a distance to an object. Accordingly, the sensitivity and the signal-to-noise ratio may be improved. The three-dimensional image sensor 900 may be integrated with the processor 1010 in one chip, or the three-dimensional image sensor 900 and the processor 1010 may be implemented as separate chips.

The three-dimensional image sensor 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The computing system 1000 may be any computing system using a three-dimensional image sensor. For example, the computing system 1000 may include a digital camera, a mobile phone, a smart phone, a portable multimedia player (PMP), a personal digital assistant (PDA), etc.

FIG. 34 illustrates a block diagram of an exemplary embodiment of an interface employable in the computing system of FIG. 33.

Referring to FIG. 34, a computing system 1100 may be implemented by a data processing device that uses or supports a mobile industry processor interface (MIPI) interface. The computing system 1100 may include an application processor 1110, a three-dimensional image sensor 1140, a display device 1150, etc. A CSI host 1112 of the application processor 1110 may perform a serial communication with a CSI device 1141 of the three-dimensional image sensor 1140 via a camera serial interface (CSI). In some embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some embodiments, the DSI host 1111 may include a serializer (SER), and the DSI device 1151 may include a deserializer (DES). The computing system 1100 may further include a radio frequency (RF) chip 1160 performing a communication with the application processor 1110. A physical layer (PHY) 1113 of the computing system 1100 and a physical layer (PHY) 1161 of the RF chip 1160 may perform data communications based on a MIPI DigRF. The application processor 1110 may further include a DigRF MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra wideband (UWB) 1120, a wireless local area network (WLAN) 1220, a worldwide interoperability for microwave access (WIMAX) 1130, etc. However, the structure and the interface of the electric device 1000 are not limited thereto.

Features and/or embodiments described herein may be applied to any photo-detection device, such as a three-dimensional image sensor providing image information and depth information about an object. For example, one or more embodiments may be applied to a computing system, such as a face recognition security system, a desktop computer, a laptop computer, a digital camera, a three-dimensional camera, a video camcorder, a cellular phone, a smart phone, a personal digital assistant (PDA), a scanner, a video phone, a digital television, a navigation system, an observation system, an auto-focus system, a tracking system, a motion capture system, an image-stabilizing system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A unit pixel included in a photo-detection device, the unit pixel comprising:
   a floating diffusion region in a semiconductor substrate;
   a ring-shaped collection gate over the semiconductor substrate;
   a ring-shaped drain gate over the semiconductor substrate;
   a drain region in the semiconductor substrate; and
   a ring-shaped photo-charge storing region in the semiconductor substrate between the floating diffusion region and the drain region, wherein the collection gate and the drain gate are respectively arranged between the floating diffusion region and the drain region.

2. The unit pixel as claimed in claim 1, wherein the collection gate surrounds the floating diffusion region, the drain gate surrounds the collection gate, and the drain region surrounds the drain gate.

3. The unit pixel as claimed in claim 1, wherein the floating diffusion region is located at a center, and in comparison to the collection gate and the drain gate, the drain region is outermost relative to the floating diffusion region.

4. The unit pixel as claimed in claim 1, wherein the collection gate and the drain gate have circular or polygonal ring shapes.

5. The unit pixel as claimed in claim 1, wherein a collection gate signal and a drain gate signal are applied to the collection gate and the drain gate, respectively,
wherein photo-charges generated in the semiconductor substrate are collected in the floating diffusion region while the collection gate signal is activated, and
wherein the photo-charges generated in the semiconductor substrate are drained into the drain region while the drain gate signal is activated.

6. The unit pixel as claimed in claim 1, wherein the photo-charge storing region is doped with impurities of an opposite conductivity type to that of the semiconductor substrate.

7. The unit pixel as claimed in claim 6, wherein the collection gate at least partially overlaps an inner portion of the photo-charge storing region, and wherein the drain gate at least partially overlaps an outer portion of the photo-charge storing region.

8. The unit pixel as claimed in claim 6, wherein the collection gate is between the photo-charge storing region and the floating diffusion region, and wherein the drain gate is between the photo-charge storing region and the drain region.

9. The unit pixel as claimed in claim 8, further comprising:
a ring-shaped pinning layer in the semiconductor substrate to cover the photo-charge storing region, the pinning layer being doped with impurities of an opposite conductivity type to that of the photo-charge storing region.

10. The unit pixel as claimed in claim 8, further comprising:
a ring-shaped photo gate over the semiconductor substrate between the collection gate and the drain gate to cover the photo-charge storing region.

11. The unit pixel as claimed in claim 1, wherein the semiconductor substrate includes a plurality of photo-charge generating regions doped with impurities of a same conductivity type and different concentrations.

12. A photo-detection device, comprising:
a sensing unit configured to convert received light to an electrical signal, the sensing unit including at least one unit pixel; and
a control unit configured to control the sensing unit,
wherein the unit pixel includes:
a floating diffusion region in a semiconductor substrate,
a ring-shaped collection gate over the semiconductor substrate,
a ring-shaped drain gate over the semiconductor substrate,
a drain region in the semiconductor substrate, and
a ring-shaped photo-charge storing region in the semiconductor substrate between the floating diffusion region and the drain region, the collection gate and the drain gate respectively arranged between the floating diffusion region and the drain region.

13. The photo-detection device as claimed in claim 12, wherein the sensing unit includes a pixel array in which a plurality of unit pixels are arranged in a rectangular or triangular grid.

14. The photo-detection device as claimed in claim 13, wherein drain regions of the plurality of unit pixels are integrally formed and are spatially coupled to each other in the semiconductor substrate.

15. The photo-detection device as claimed in claim 13, wherein floating diffusion regions of at least two of the plurality of unit pixels are electrically coupled to each other and correspond to a pixel group.

16. The photo-detection device as claimed in claim 13, wherein the plurality of unit pixels are regularly omitted at least at one grid point of the grid, and wherein the sensing unit further includes a readout circuit at the grid point where the unit pixel is omitted to provide outputs of the plurality of unit pixels.

17. The photo-detection device as claimed in claim 13, wherein the plurality of unit pixels include color pixels and depth pixels, and wherein the photo-detection device is a three-dimensional image sensor.

18. A method of measuring a distance, the method comprising:
emitting light to an object;
converting received light corresponding to the emitted light into an electrical signal using a plurality of bin signals having numbers of cycles that increase according to phase differences with respect to the emitted light; and
calculating a distance to the object based on the electrical signal, wherein the received light is converted into the electrical signal using a unit pixel, the unit pixel including:
a floating diffusion region in a semiconductor substrate;
a ring-shaped collection gate over the semiconductor substrate;
a ring-shaped drain gate over the semiconductor substrate; and
a drain region in the semiconductor substrate, wherein the collection gate and the drain gate are respectively arranged between the floating diffusion region and the drain region, wherein duty ratios of the plurality of bin signals increase according to the phase differences with respect to the emitted light.

19. The method as claimed in claim 18, wherein converting the received light into the electrical signal comprises:
collecting photo-charges generated by the received light in a floating diffusion region while the plurality of bin signals are activated; and
draining the photo-charges generated by the received light into a drain region while the plurality of bin signals are deactivated.

20. The method as claimed in claim 18, further comprising:
adjusting phases and duty ratios of the plurality of bin signals to be concentrated on a phase corresponding to the calculated distance; and
correcting the distance to the object using the plurality of bin signals having the adjusted phases and duty ratios.

21. A method of measuring a distance, the method comprising:
emitting light to an object;
converting received light corresponding to the emitted light into an electrical signal using a plurality of bin signals having numbers of cycles that increase according to phase differences with respect to the emitted light; and
calculating a distance to the object based on the electrical signal, wherein the received light is converted into the electrical signal using a single-tap pixel having a ring-shaped structure where a floating diffusion region of the pixel is located at a center of the ring-shaped structure and a drain region of the pixel is arranged an outer portion of the ring-shaped structure,, wherein duty ratios of the plurality of bin signals increase according to the phase differences with respect to the emitted light.

* * * * *